United States Patent [19]
Dent

[11] Patent Number: 5,673,291
[45] Date of Patent: Sep. 30, 1997

[54] SIMULTANEOUS DEMODULATION AND DECODING OF A DIGITALLY MODULATED RADIO SIGNAL USING KNOWN SYMBOLS

[75] Inventor: Paul W. Dent, Stehags, Sweden

[73] Assignee: Ericsson Inc., Research Triangle Park, N.C.

[21] Appl. No.: 305,787

[22] Filed: Sep. 14, 1994

[51] Int. Cl.$^6$ .............................. H04L 27/00; H03D 1/00; H04Q 1/20

[52] U.S. Cl. .................. 375/262; 375/281; 375/331; 375/341; 329/304; 371/40.1; 371/43

[58] Field of Search ................... 375/259, 340, 375/279, 341, 342, 308, 261, 262, 265, 281, 283, 330, 331, 332, 267; 371/43, 37.1, 40.1; 329/304; 332/104

[56] References Cited

U.S. PATENT DOCUMENTS

| | | | |
|---|---|---|---|
| 4,559,625 | 12/1985 | Berlekamp et al. | 371/2 |
| 5,048,059 | 9/1991 | Dent | 375/340 |
| 5,052,000 | 9/1991 | Wang et al. | 371/43 |
| 5,084,669 | 1/1992 | Dent | 324/76.82 |
| 5,241,563 | 8/1993 | Paik et al. | 375/200 |
| 5,287,374 | 2/1994 | Parr | 371/43 |
| 5,301,209 | 4/1994 | Wei | 375/265 |
| 5,331,666 | 7/1994 | Dent | 375/341 |
| 5,335,250 | 8/1994 | Dent et al. | 375/10 |
| 5,402,447 | 3/1995 | Roney, IV | 375/340 |
| 5,416,801 | 5/1995 | Chouly et al. | 375/260 |
| 5,432,821 | 7/1995 | Polydoros et al. | 375/340 |
| 5,438,590 | 8/1995 | Tzukerman et al. | 375/259 |

FOREIGN PATENT DOCUMENTS 594551  4/1994  European Pat. Off. .

OTHER PUBLICATIONS

Sedat Ölcer et al., "Difference-Metric Viterbi Decoding of Multilevel Class-IV Partial-Response Signals", *IEEE Transactions on Communications*, vol. 42, No. 2/3/4, Feb./Mar./Apr. 1994., pp. 1558-1570.

Steven S. Pietrobon et al., "Rotationally Invariant Trellis Codes", *Coded Modulation and Bandwidth-Efficient Transmission*, pp. 55-65 (1992).

G. Ungerboeck, "The State of Art in Trellis Coded Modulation", *Coded Modulation and Bandwidth-Efficient Transmission*, pp. 3-14 (1992).

"Complexity-Reduced Multilevel Coding with Rate-Compatible Punctured Convolutional Codes"—Jung-Fu Cheng et al., *Proceedings of the Global Communications Conference*, vol. 2, Nov. 29, 1993, pp. 814-818.

Primary Examiner—Wellington Chin
Assistant Examiner—William Luther
Attorney, Agent, or Firm—Burns, Doane, Swecker & Mathis, L.L.P.

[57] ABSTRACT

Systems and methods according to the present invention provide a combination of demodulation and decoding, termed decodulation herein. By using knowledge of known symbols, decoding known symbols first, and then using the information obtained by decoding known symbols to decode unknown symbols, improved performance can be achieved. This technique can also be used to alleviate the conventional 3dB loss suffered systems using differentially coding and modulation as compared to coherent detection systems.

43 Claims, 8 Drawing Sheets

```
TDMA BURST 1:  ..U  U  U  U  U  K  U  K  U  K  U  K  U  U  U  U  U
DEMODULATION ORDER:   21 13  1     9     5    17 25 33 41 49

TDMA BURST 2:  ..U  U  U  U  U  K  U  K  U  K  U  K  U  U  U  U  U
DEMODULATION ORDER: 46 38 30 22 14     2    10     6    18 26 34 42 50

TDMA BURST 3:  ..U  U  U  U  U  K  U  K  U  K  U  K  U  U  U  U  U
DEMODULATION ORDER: 47 39 31 23 15     3    11     7    19 27 35 43 51

TDMA BURST 4:  ..U  U  U  U  U  K  U  K  U  K  U  K  U  U  U  U  U
DEMODULATION ORDER: 48 40 32 24 16     4    12     8    20 28 36 44 52
```

Fig. 1

```
   x2   a1   x4   a3   x6   a5   x8   a7 .......   TRANSMITTED BLOCK A
   / \ / \ / \ / \ / \ / \ / \ / \
   u1   u2   u3   u4   u5   u6   u7   u8   u9 ..... COMPLEX SAMPLES FOR BLOCK A a2   b1   a4   b3   a6   b5   a8   b7 .......   TRANSMITTED BLOCK B
   / \ / \ / \ / \ / \ / \ / \ / \
   z1   z2   z3   z4   z5   z6   z7   z8   z9 ..... COMPLEX SAMPLES FOR BLOCK B b2   c1   b4   c3   b6   c5   b8   c7 .......   TRANSMITTED BLOCK C
```

Fig. 6

```
   x2   a1   x4   a3   x6   a5   x8   a7 .......   TRANSMITTED BLOCK A
   / \ / \ / \ / \ / \ / \ / \ / \
   u1   u2   u3   u4   u5   u6   u7   u8   u9 ..... COMPLEX SAMPLES FOR BLOCK A a2   b1   a4   b3   a6   b5   a8   b7 .......   TRANSMITTED BLOCK B
   / \ / \ / \ / \ / \ / \ / \ / \
   z1   z2   z3   z4   z5   z6   z7   z8   z9 ..... COMPLEX SAMPLES FOR BLOCK B b2   c1   b4   c3   b6   c5   b8   c7 .......   TRANSMITTED BLOCK C
```

Fig. 8

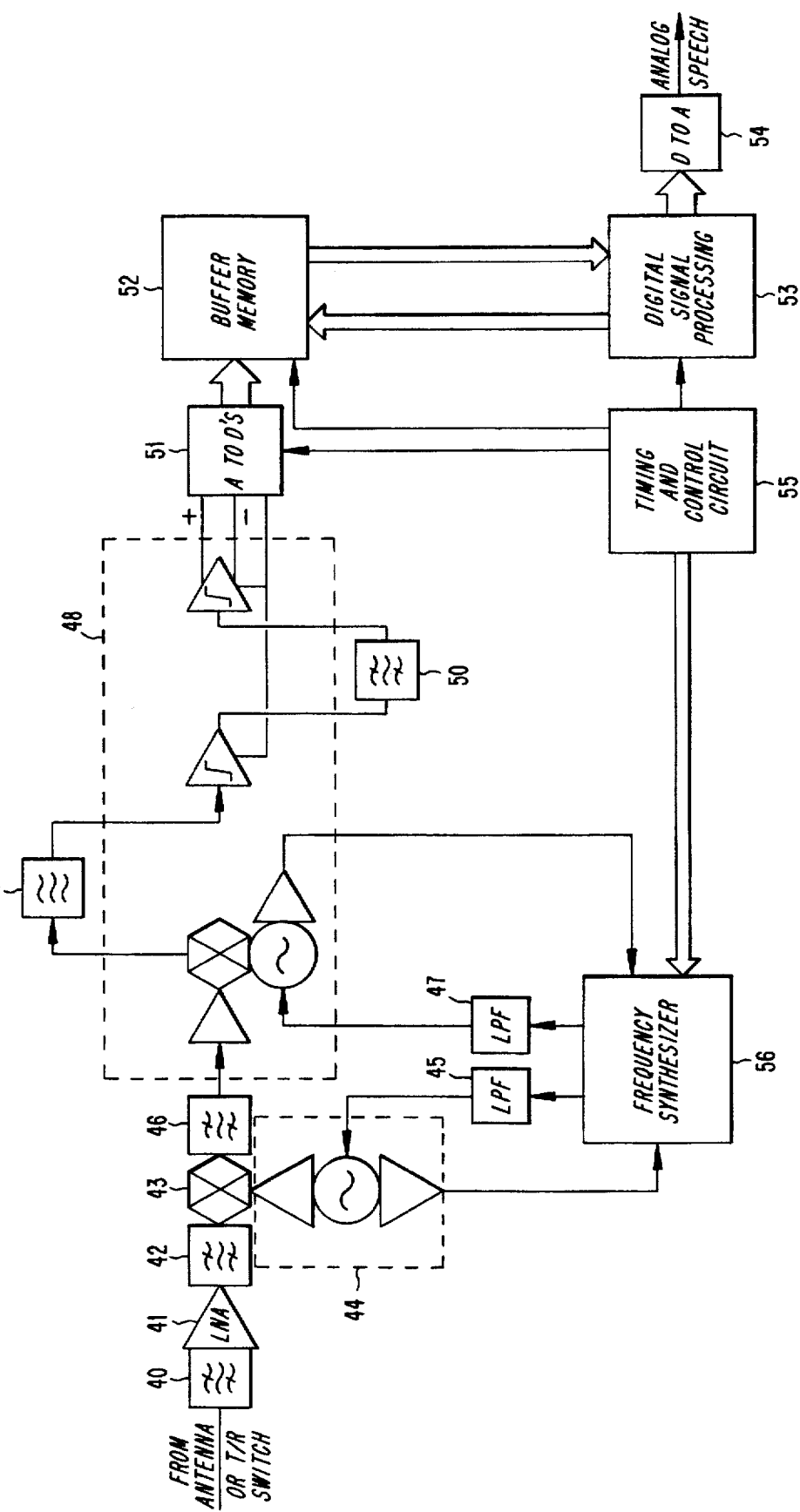

SIMULTANEOUS DEMODULATION AND DECODING OF A DIGITALLY MODULATED RADIO SIGNAL USING KNOWN SYMBOLS

BACKGROUND

The present invention relates generally to a method and apparatus for simultaneously demodulating and decoding a digitally-modulated radio signal, such as a cellular wireless telephone signal.

Combined modulation and coding, and conversely demodulation and decoding, is a technique which has been associated with publications by Ungerboeck. So-called Ungerboeck codes can be used to encode data bits for transmission into a series of radio signal phase changes. More than one phase change per transmitted data bit was in general envisaged, and also each phase change depended on more than one data bit. Demodulating and decoding such a signal involved hypothesizing a sequence of bits encoded at the transmitter, using a model of the encoding process to predict what phase changes should be observed at the receiver corresponding to each hypothesis, and comparing the actually received signal with the hypothesized signal to determine the mismatch and thus accumulate "votes" for and against each hypothesis. The hypothesized sequence ending up with the most votes was then deemed to be that transmitted.

One problem with Ungerboeck coding is that the data is encoded into a series of sequential signal changes. On fading channels, a fading dip can wipe out a whole series of such signal changes and thus an entire data bit. Such a non-interleaved code is unable to bridge even short fades.

To combat fading, it is desirable to employ interleaving so that adjacent symbols out of the encoder are transmitted well apart in time, and thus when re-ordered at the decoder, adjacent symbols into the decoder have come from signal segments that are not in the same fade region. After de-interleaving at the receiver, a fading dip will be spread out in time so that errors are not clumped. Unfortunately, an Ungerboeck decoder for interleaved, coded signals are usually too complicated for consideration, as its complexity depends exponentially on the total time, in symbols, that the code spans.

An alternative conventional technique for coded, interleaved and modulated signals is separate demodulation followed by de-interleaving and separate decoding. When the transmission channel suffers from time-dispersion, i.e., from delayed echoes of the transmitted signal, an equalizer can be used to give adequate demodulation performance. A sequential maximum-likelihood equalizer such as that described, for example, in U.S. patent application Ser. No. 07/894,933 entitled "Adaptive Maximum Likelihood Demodulator" filed on Jun. 8, 1992, and U.S. patent application Ser. No. 07/965,848 entitled "Bidirectional Demodulation" filed on Oct. 22, 1992, which are incorporated herein by reference, has a complexity exponentially dependent on how many symbols delayed the echoes are. Such an equalizer can deliver "soft" rather than "hard" decisions that, after de-interleaving, are presented to the error-correction decoder. An error-correction decoder for convolutional codes also has a complexity that depends exponentially on the constraint length of the code.

The disadvantage of separate demodulation and decoding, even with an equalizer that delivers soft decisions, is that the demodulator performance can fail at low signal to noise ratios. This arises particularly in the case of time-varying channels where the phase of the signal is corrupted by, for example, Doppler effects and multipath propagation. For such channels, it can be desirable to modulate data onto the radio signal by differentially changing the phase of the signal from one symbol period to the next, so that it can be demodulated by comparing signal values spaced only one symbol apart, a sufficiently short time span so that the channel phase changes insignificantly over that time. Unfortunately there is usually a loss on the order of 3dB in comparing one noisy received signal value with another noisy signal value in order to determine the transmitted symbol when using differential demodulation. This loss cannot be recovered in the error correction decoding process following the demodulation process when using conventional separate demodulation and decoding processes.

Another deficiency of conventional separate demodulation and decoding is that the separate demodulator can make mistakes due to noise and select a wrong sequence of bits as the "best" output. This single error event, when deinterleaved, becomes several separate bit error events so that the error correction decoder has now to cope with a larger number of errors. Thus maximum likelihood demodulators followed by de-interleaving and then maximum likelihood convolutional decoders can suffer a degradation in performance.

Accordingly, it would be desirable for the error detection/correction decoder process to be incorporated with the demodulation process into a single maximum likelihood demodulator so that the demodulation can be assisted by the decoding to avoid mistakes due to noise.

SUMMARY

These and other problems, drawbacks and limitations of conventional demodulation and decoding methods and systems are overcome by using methods and systems according to the present invention. Therein, a digital data stream to be transmitted is first error-correction coded using, for example, convolutional coding. The coded data bits are then distributed in time according to an interleaving algorithm that can also insert a limited number of symbols known a-priori to the receiver, for example, sync symbols. The coded and interleaved data bits are then modulated onto a radio signal which may be transmitted in bursts.

The inventive demodulator comprises a Viterbi maximum length sequence estimator that hypothesizes data bit sequences. With the aid of a model of the coding and modulation process (codulation process) radio signal samples ("symbols") that should be observed are predicted. These are compared with the actually received complex signal waveform and a mismatch computed. The Viterbi MLSE machine then proceeds to determine the data bit hypothesis that gives the lowest mismatch, and outputs this hypothesis. The inventive decodulation process according to one exemplary embodiment first computes mismatches for symbols lying adjacent to known symbols and accumulates the mismatches into a total mismatch or path metric for the hypothesized symbol sequence. This process is termed "decodulating a symbol" herein. The known symbols can, for example, be sync symbols.

When all positions next to known symbols are exhausted, error-corrected data can begin to emerge from the decoder and so the first decoded symbol can now be considered a known symbol with relatively high certainty. The process then continues, treating this symbol as a known symbol with which to assist in the decodulation of a neighboring symbol. This flushes out another error-corrected data symbol and so on until all data has been decoded. This process is based in part on knowledge by the receiver of the order of placement of symbols in the transmitted stream and on the placement of any known sync symbols, i.e., of the interleaving pattern. Choice of transmit interleaving formats to facilitate decodulating is described in detail herein.

Another of the advantages of techniques according to the present invention is to permit data to be modulated differentially, that is to be encoded in the transitions between two signal waveform points rather than in the absolute value of the waveform, without incurring the usual 3dB differential loss. Differential rather than absolute (coherent) modulation is desirable for radio channels that vary rapidly over the space of a few symbols, which would hinder coherent demodulation. The present invention provides the benefit for time-varying channels of differential modulation without the usual 3dB performance disadvantage. A diagonally interleaved, coded and differentially modulated signal format is disclosed that can retrieve at least half and up to all of the 3dB differential modulation loss.

BRIEF DESCRIPTION OF THE DRAWINGS

The foregoing, and other, objects, features and advantages of the present invention will be more readily understood upon reading the following detailed description in conjunction with the drawings in which:

FIG. 1 illustrates signal transmission format according to an exemplary embodiment of the present invention;

FIG. 3 illustrates a receiver block diagram for decoding a received signal such as that shown in FIG. 1;

FIG. 6 illustrates a block-diagonally interleaved and differentially modulated binary transmission format;

FIG. 8 illustrates modification of differential modulation for skipping over uncoded symbols.

DETAILED DESCRIPTION

Figure 2A:
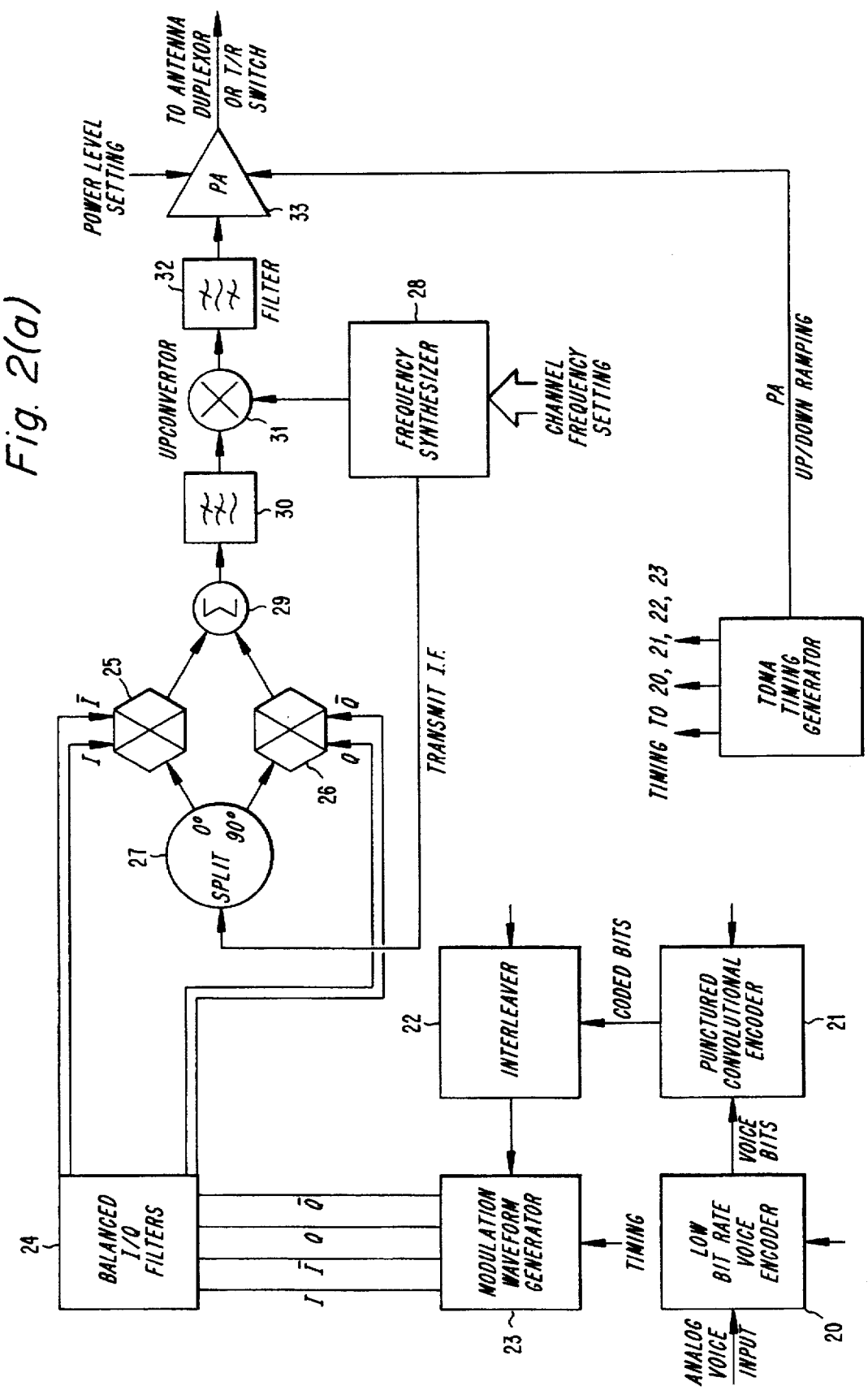
FIG. 2(a) illustrates a transmitter block diagram for producing a signal such as that of FIG. 1.

Referring to FIG. 1, a number of coded symbols to be conveyed to a receiver are marked "U" for unknown and interleaved with a number of known symbols marked "K". The symbols are shown distributed between a number of bursts in an assumed Time Division Multiple Access (TDMA) transmission system, but this is by way of example only, and the invention can be applied equally to continuous (e.g., FDMA or CDMA) as well as burst transmissions.

As an example, a 40mS TDMA frame contains 300 symbol periods and is divided into three time slots. One radio transmitter is allocated one timeslot per frame in which to transmit approximately 100 symbols. Some of the symbol periods at the beginning and end of transmit bursts are reserved for power up/down ramping and thus are not used for data transmission. The bursts numbered 1 to 4 in FIG. 1 refer to corresponding time slots allocated to the same transmitter in successive 40mS TDMA frames.

Alternatively, a hybrid TDMA/FDMA access format as described in U.S. patent application Ser. No. 08/179,954 entitled "TDMA/FDMA/CDMA Hybrid Radio Access Methods" filed on Jan. 11, 1994, which disclosure is incorporated here by reference, can be used. This alternative involves each transmitter transmitting for two out of the three timeslots, such that in any timeslot two transmissions overlap. However, the two simultaneously transmitting devices use respectively the upper and lower halves of the allocated frequency channel spectrum when overlapping in time in order to avoid mutual interference. When using this type of access format, the notation (burst 1, burst 2) used in FIG. 1 will refer respectively to a transmitter's transmission in a first of three timeslots using a lower half of the channel spectrum and a transmission in a second timeslot using an upper half of the channel spectrum. Burst 3, burst 4 would then refer to the same occurrence in the following 40mS TDMA frame.

A desirable goal, for example, is a 90% efficient transmission format that allocates 90 out of the 100 symbol periods per burst to data transmission. FIG. 1 illustrates four symbols marked K in each burst devoted to sync symbols and the remaining six symbol periods per burst are used for up- and down-ramping of three symbols duration each. The known symbols are not clustered, as there is no benefit in doing so for channels that can change over the space of a few symbols. Instead, unknown data symbols are deliberately placed between the known symbols for the reasons explained below.

Differential modulation is used so that symbols are impressed on the carrier by changing its phase over a symbol period. For example, the modulation scheme known as Pi/4-DQPSK can be used in which the phase change is one of the four values +/-45 or +/-135 degrees, thus encoding two information bits.

When the symbol and therefore the phase change is known, there is a known relationship between the starting and ending signal vector. By rotating the vector received at the start of a known symbol through this known amount it can be aligned with the end vector value received and added to it constructively, thus improving the signal-to-noise ratio on the resultant by 3dB. This improved end vector is the start vector for the following, unknown symbol, and the improvement of signal to noise ratio thus allows the unknown symbol to be more reliably determined by comparison with a hypothesized symbol.

If the symbol following the unknown symbol is also a known symbol, the same procedure may be followed in reverse to establish the phase at the beginning of the second sync symbol and the end of the unknown symbol. Since both the start and end vectors of the unknown symbol are then of 3dB higher SNR, this translates directly to 3db improvement in demodulation of the unknown symbol. Mathematically this is described by the following:

Let Z(i−1) be the signal's complex value sampled at the beginning of a first known symbol;

Let Z(i) be the sample at the end of the first known symbol and the beginning of the unknown data symbol;

Let the known differential phase rotation applied by the first known symbol be Theta1; then U(i)=(Z(i−1)Exp(j.Theta1)+Z(i))/2 is a better estimate of the signal vector at the start of the unknown symbol.

Let Z(i+1) be the signal vector at the end of the unknown symbol and the start of a second known symbol, and let Z(i+2) be the signal vector at the end of the second known symbol;

Let Theta2 be the known differential phase rotation applied by the second known symbol; then $U(i+1)=(Z(i+1)+Z(i+2)Exp(-j.Theta2))/2$ is a better estimate of the signal vector at the end of the unknown symbol.

Therefore an improved estimate of the unknown symbol is:

$$U(i+1).U^*(i)$$

where * means complex conjugate and where the real and imaginary parts yield soft values for the two bits of the quaternary symbol respectively. These soft values are used with suitable scaling in a convolutional decoding process illustrated in FIG. 4. Before describing FIG. 4, exemplary transmitter and receiver block diagrams will be described with the aid of FIGS. 2(a), 2(b) and 3 respectively.

Referring to FIG. 2(a), an analog speech signal to be transmitted is converted into a digital bitstream by low bitrate voice encoder 20. This encoder can, for example, include an 8 kilosamples/second PCM AtoD convertor followed by a Residual Excited, Linear Predictive coder (RELP), Adaptive Delta PCM (ADPCM), Vector Code-Book Excited Linear Prediction (VSELP) or similar circuit. Encoder 20 converts speech to a low bitrate while preserving subjective quality, including, for example, faithful reproduction of background sounds.

The bits produced by encoder 20 do not typically all have the same significance in affecting the perceived speech quality. Bits can thus be sorted according to their perceptual significance so that error correction coder 21 can direct its efforts most effectively.

Error correction coder 21 can produce a greater number of output bits than input bits to provide redundancy for transmission. Also, output bits are a function of plural input bits, and conversely, each input bit affects plural output bits so that loss of one output bit in transmission does not necessarily mean that an information bit is lost. An exemplary coder for use as coder 21 is a punctured convolutional coder. A convolutional coder comprises a shift register of length L bits through which the input data bits are passed. A first set of taps on the register selects a number of delayed bits and combines them by an Exclusive-OR operation to produce a first coded bit or parity bit P1. A second set of taps selects a different combination of delayed bits to produce P2, and so-on. If the total number of parity bits produced for each input data bit is N, then the coder is called a rate 1/N coder. For example, if two parity bits are produced for each input bit shifted in, the coder is a "rate half" coder. A given input bit can affect more than one P1 or P2 and thus affects several transmitted bits. The number of bits affected can be calculated as follows: if P1 is a combination of N1 register taps, then N1 P1 values will be affected as a given data bit passes the taps used. If P2 is produced using N2 taps, then N2 P2 values will be affected by a given data bit. In total therefore, N1+N2 output values depend on each input bit.

A punctured convolutional code can give different levels of protection to coded speech bits of different perceptual significance. It can be assumed that the amount of protection is proportional to the number of coder output bits transmitted that depend on that speech bit. This can be varied by omitting to transmit certain of the parity bits P1,P2,P3 . . . according to a deletion or "puncturing" strategy. For example, if only P1 is transmitted after a particular register shift, the number of output bits depending on the N1 input bits selected by the register taps is reduced by one. N1 input bits thus receive slightly less protection. These can be arranged to be bits of slightly lower perceptual significance. On the other hand, if a third parity bit P3 depending on N3 register taps is calculated but not normally transmitted, it can be additionally transmitted whenever it is desired to give N3 of the input speech bits greater protection. Thus by omitting to transmit certain parities at some instants and transmitting extra parities at others, a continuously graded amount of error protection can be provided for different input bits while still sending the same total number of transmitted bits. The protection grades can be sorted according to the protection provided (i.e., according to the number of transmitted bits that depend on each input bit) and then mapped to the speech bits sorted in order of perceptual significance. A more detailed explanation of punctured convolutional coding according to an exemplary embodiment of the present invention is described below.

When speech is digitized by advanced, low-bitrate techniques, not all bits are of equal perceptual significance. Therefore in transmitting the digital speech over a fading radio channel, adapting the amount of error correction coding protection to each bit according to its perceptual significance can be the optimum use of bandwidth.

For example, assume that rate ⅓, 1/2 and ⅔rds codes are available as well as no coding (rate 1), and that 163 bits have to be coded to 288 bits for transmission every 40mS.

Denoting the bits coded by rate ⅓, 1/2, 2/3rds and 1 respectively by a, b, c, and d, provides the following system of equations:

|   | | |
|---|---|---|
| | $a+b+c+d$ | $= 163$ |
| and | $3a+2b+1.5c+d$ | $= 288$ |
| therefore | $2a+b+0.5c$ | $= 125$ |

Assume that only the most significant 11 bits warrant the extreme protection of rate ⅓, i.e., a=11; then $$b+0.5c=103 \text{ or } 2b+c=206$$

Thus the absolute maximum number b of rate ½ coded bits is 103 if c=0. The following possibilities thus exist:

| a | b | c | d |
|---|---|---|---|
| 11 | 103 | 2 | 49 |
| 11 | 102 | 2 | 48 |
| 11 | 101 | 4 | 47 |
| 11 | 100 | 6 | 46 |
| . | . | . | . |
| . | . | . | . |
| . | . | . | . |
| 11 | 54 | 98 | 0 |

Other possibilities exist with different values of "a". The maximum possible value of "a" is 62, giving:

| a | b | c | d |
|---|---|---|---|
| 62 | 0 | 2 | 99 |

If some of the 99 uncoded bits are too perceptually significant to tolerate no coding (i.e., 8–10% BER) then "a" can be reduced, for example, by transferring "a" bits to "b" bits:

| | | | |
|---|---|---|---|
| 61 | 1 | 4 | 97 |
| 60 | 2 | 6 | 95 |
| 59 | 3 | 8 | 93 |
| . | . | . | . |
| . | . | . | . |

|    |    |    |    |    |
|----|----|----|----|----|
|    | .  | .  | .  | .  |
|    | 31 | 31 | 64 | 37 |
|    | .  | .  | .  | .  |
|    | .  | .  | .  | .  |
|    | .  | .  | .  | .  |
| or | 36 | 36 | 34 | 57 |
|    | 35 | 36 | 38 | 54 |
|    | 34 | 36 | 42 | 51 |
|    | 33 | 36 | 46 | 48 | ............ (1)
| etc. |

The latter possibility represents perhaps the most even distribution of bits between the four levels of protection possible.

Many different ways of applying the above unequal levels of protection can be devised. For example, if convolutional coding is employed, it is very desirable to avoid the overhead of tail bits. Tail bits can be avoided either by use of continuous convolutional encoding/decoding, or by tail biting.

The latter example shown in row (1) of bit allocation will be used to describe continuous convolutional encoding. Therein, 33 bits per 40mS are to be rate 1/3rd protected. The 33 bits from each 40mS speech frame are strung together to form a continuous input bit stream to an optimized rate 1/3rd convolutional encoder. The 99 bits per 40mS output from the encoder are interleaved both within TDMA bursts and between bursts for transmission. The interleaving should be limited only by the speech delay that can be tolerated.

Likewise, the 36 bits from each frame for rate ½ protection are concatenated to form a continuous bitstream input to an optimized rate ½ encoder. The 72 bits per 40mS output are interleaved both within and between frames with the other encoder output bits.

The 46 rate ⅔rds protected bits are concatenated with similar blocks to form the bitstream input to a rate ⅔rds encoder that produces an output of 69 bits per 40mS. These are also interleaved with the previous encoder outputs together with the 48 bits/40mS uncoded information, giving in total 88 bits per 40mS transmitted.

One potential disadvantage of this method without CRCs is that the rate 1/3rd decoder, for example, can not be sure that it has decoded a 33-bit block correctly until it has received some bits from the next frame to flush the decoder through. Thus an extra delay can be incurred at the receiver. This can be avoided either by just using the bits corresponding to the best metric, which may not be optimum, or by adding a CRC which is checked for on every Viterbi state to give a firmer indication of the correct state, which unfortunately adds overhead and reduces the amount of coding protection possible, or by using "tail biting" as described next.

According to another exemplary embodiment of the present invention using tail-biting convolutional encoding, the 33 bits to be rate ⅓ encoded are considered to be arranged in a closed circle. A constraint length 6 convolutional encoder, for example, would starts with bits 0 to 5 and produce from them three encoded bits. The process would then move around the circle one stage to produce three more bits using bits 1 to 6, and so on, until 99 output bits have been produced, the last three depending on bit 31 and on bits 0 to 4 again. The 99 bits are then interleaved with the output of the other tail-biting encoders and the uncoded bits to give 288 total per 40mS frame. The decoder operates on the received 99 coded bits in a similar manner, arranged in a circle, and continues around until all bits have been decoded and slightly beyond until bits decoded a second time agree with bits decoded on the first revolution. Thus using tail-biting, decoding can be completed without waiting to receive the next frame.

In reality, tail-biting encoders are a form of block-coding, which however may not be optimum in the Hamming distance sense. The 33 bit blocks should of course ideally be encoded to 99 bits using an optimum (99,33) block code. Tail-biting and convolutional decoders are however much simpler to implement than large block coders and decoders.

Having described an exemplary method for implementing multiple-rate coding using punctured convolutional encoding and decoding, it will now be shown that by intelligent interleaving of the different rates even the error rate of the "uncoded" bits can be substantially reduced. A convolutional encoder consists conceptually of a tapped shift register through which bits to be coded are shifted. On each shift, a first set of taps are exclusive-ORed to produce a first coded bit, a second set of taps are XORed to product a second coded bit etc., up to the desired amount of redundancy (i.e., the reciprocal of the rate). Thus, a constraint length 6, rate ⅓ encoder is illustrated in FIG. 2(b).

Figure 2B:
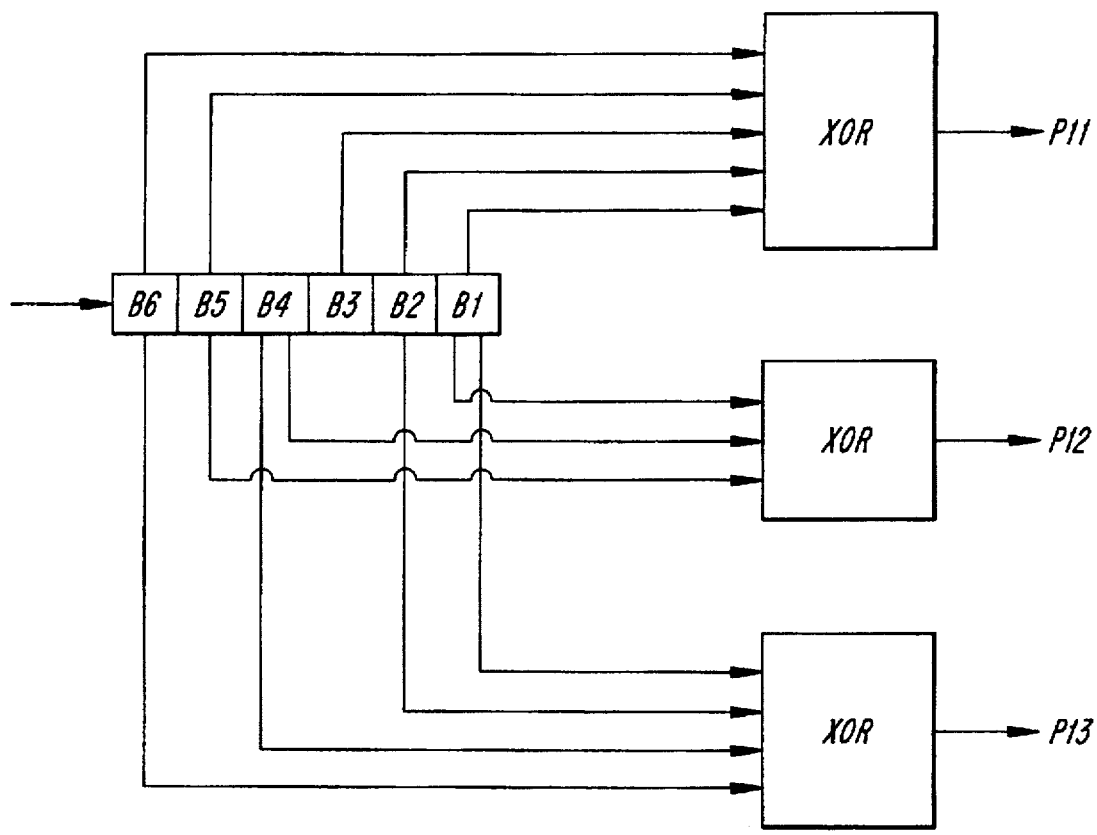
FIG. 2(b) illustrates an exemplary rate ⅓ encoder that can be used in the transmitter of FIG. 2(a)

It may be determined that, at the instant depicted in FIG. 2(b), the output bits are given by:

| P11 = B1 + B2 + B3 |      | + B5 | + B6 |
|--------------------|------|------|------|
| P12 = B1           | + B4 | + B5 |      |
| P13 = B1 + B2      | + B4 |      | + B6 |

At subsequent instants, the output bits will be given by:

| P21 = B2 + B3 + B4 |      | + B6 | + B7 |
|--------------------|------|------|------|
| P22 = B2           | + B5 | + B6 |      |
| P23 = B2 + B3      | + B5 |      | + B7 |
| P31 = B3 + B4 + B5 |      | + B7 | + B8 |
| P32 = B3           | + B6 | + B7 |      |
| P33 = B3 + B4      | + B6 |      | + B8 |
| etc.               |      |      |      |

The transmitted bits Pij on sequential register shifts i=1,2,3 etc. can be arranged in three rows j=1,2,3 as follows:

| P11 | P21 | P31 | P41 | P51 | P61 | ... |
| P12 | P22 | P32 | P42 | P52 | P62 | ... |
| P13 | P23 | P33 | P43 | P53 | P63 | ... |

Which of these are affected by B7, for example as it moves through the encoding shift register, can be indicated by a cross in the appropriate box of this 3 by 6 matrix:

```
x   x       x   x   x
    x   x           x
x       x       x   x
```

Thus any bit such as B6 affects a number of transmitted bits equal to the number of crosses above, i.e., 12. A mistake in decoding B6 would therefore cause mismatch between 12 of the received bits and their corresponding expected values, and it is thus less likely that a mistake will be made.

The reduction in error rate will clearly still be large even if not all of the twelve Pij's that are effected by B6 are transmitted. For example, if P11, P22 and P33 are not transmitted, all of which depend on B6, then the number of transmitted bits that depend on B6 will be 9 instead of 12. At the same time the number of transmitted bits that depend on B1 reduces to 11, on B2 to 10, on B3 to 10, B4 to 11 and on B5 to 10.

In general, by targeting to delete transmitted bits that depend on B6 it may be arranged that the amount of coding given to B6 is reduced while causing a smaller loss of coding protection for neighboring bits. The protection given to each data bit encoded by such a punctured code can ultimately be related to the number of transmitted bits that depend on it, and so that data bit can be used for a speech bit of corresponding perceptual significance.

If a regular pattern of deletions is employed, for example by deleting one Pij out of the three in every column, a rate ½ code is produced. The deleted P bit should not necessarily always be in the same row, but might be permitted according to a regular puncturing pattern.

Likewise, a rate ⅔ code can be produced by deleting two P bits from half the columns and one P bit from the other half, so that three bits are transmitted for every two encoding register shifts. Rate 1 can be produced by deleting all except one P bit in every column. However, it is interesting to note that the number of transmitted bits depending on a given data bit does not reduce to one, as it would for no coding at all.

For example, if the bits transmitted are:

P11,P22,P23,P41,P53,P62; P71,P82,P93, etc., then B6 still affects six transmitted bits. If these are interleaved to different TDMA frames or frequency hops of a radio transmission format, or to different positions within the same frame or hop where fading is substantially uncorrelated then a measure of protection of B6 against fading will be obtained without having increased the number of transmitted bits. A Viterbi maximum likelihood sequence estimator may still employed to decode such a "rate 1" code.

The potential advantage of rate 1 codes of this type with long constraint length is to give the same bit error rate curve for a Rayleigh fading channel as for a static channel, as the sum of the Rayleigh faded noise contributions to the metric of a given decoded bit must, through the central limit theorem, simply approach Gaussian noise with the same mean variance. Such coding that can give gain without bandwidth expansion is one novel aspect of the present invention. To operate efficiently, such "rate 1" coded bits should be bordered by more heavily coded bits, and in general, a continuous range of coding protection is produced by the invention by interleaving bits having different amounts of coding. This is in contrast with the prior art use of punctured convolutional codes, which typically group all the rate ⅓ coded bits together, all the rate ½ coded bits together, etc., and do not code the "uncoded bits" at all.

According to this exemplary embodiment, however, a puncturing pattern is chosen which alternates between transmitting all parities for the most heavily coded bits, and omitting one or more parities for the lesser coded bits. For example, the number of transmitted parities for each shift into the coding register of a new bit to be coded may be chosen according to the sequence 3,3,2,3,2,1,2,3,2,3,1,1,2, 1,2,2,3 . . . and so on. Given such a puncturing pattern, the number of transmitted parities that depend on each of the original information bits may be computed.

For example, information bit 1 may affect 12 transmitted parities;

bit 2 may affect 10 transmitted parities;

bit 3 may affect 7 transmitted parities;

bit 4 may affect 11 transmitted parities;

bit 5 may affect 9 transmitted parities; and so on.

Further according to this exemplary embodiment, these bits are sorted according to how many transmitted parities depend on them, for example, obtaining the following table:

| Bits affecting | 12 | 11 | 10 | 9 | 8 | 7 | 6 | 5 | 4 | 3 | 2 | 1 | parities: |
|---|---|---|---|---|---|---|---|---|---|---|---|---|---|
| | b1 | b4 | b2 | b5 | | b3 | | | | | | | |
| | b6 | b9 | | b7 | b10 | b8 | | | | | | | |
| | b11 | b14 | b13 | b15 | b12 | b16 | | | | | | | |
| | b21 | b12 | b17 | b23 | b20 | b25 | | | | | | | |
| | b24 | b18 | b22 | b28 | b27 | | etc. | | | | | | |

In the above table, only six levels of redundancy are assumed to be created, i.e., information bits affect no less than 7 and no more than 12 parities. This is not, however, meant to imply a restriction, just that in practice such a range of options may suffice.

Continuing according to this exemplary embodiment, the information bits as produced by the speech digitizing process are sorted according to their perceptual significance, that is according to how disturbing to the listener it sounds when a particular bit is in error. This can be determined in advance during the design process, preferably by subjective listening tests using a variety of speakers and listeners. Suppose that such a listening test produces the following result when speech coder bits, denoted by $c1,c2,c3$ etc. are sorted by perceptual significance from highest significance to lowest:

c1,c8,c10,c2,c7,c11,c12,c4,c5,c3,c6,c23,c34,c15,c9 . . .

The exemplary coding system now assigns the first group of c-bits (i.e., the most perceptually significant) to the b-bits that affect the greatest number of parities (e.g., 12) so that c1, c8, c10, c2 and c7 would be represented by b1, b6, b11, b21 and b24 in the above example.

Then when the bit allocation process has exhausted the number of bits that affect 12 parities, the speech bits next in significance order are assigned to those that affect 11 parities, so that speech bits c11, c12, c4, c5 and c3 would be represented by b4, b9, b14, b18 and b19 through the error correction coding process. The process continues to assign speech bits of progressively lower significance to b-bits that affect progressively fewer transmitted parities.

The above exemplary embodiment for punctured coding thus concentrates the power of the coding where it is needed most, but with a mapping of speech bits to coded bits that recognizes a more continuous range of coding protection than prior art systems that group bits simply into those that shall be protected with rate ⅓ coding, those that shall be protected with rate ½ coding etc., and those that shall not be coded at all. In particular, it may be seen that there need not be, according to this exemplary embodiment, any speech bits that affect only one transmitted bit.

A more rigorous design process for implementing this exemplary embodiment most efficiently involves simulating the transmission of the coded bits including interleaving, modulation, transmission channel imperfections, noise and interference. Many frames of transmission are simulated, and the mean error probability computed for each coded information bit b1, b2, b3, etc. These bits are then sorted by mean error rate from lowest to highest, and those having the lowest probability of error are assigned to represent speech coder output bits of greatest perceptual significance, and so on down to least perceptually significant bits being assigned to the coded bits that were observed most frequently to be in error.

Referring once again back to FIG. 2(a), after error correction coding, the coder output bits are dispersed in time by interleaver 22. The interleaver 22 ensures that adjacent bits out of the error correction coder 21 are not transmitted adjacently over the air, to avoid error clumping which would increase the risk of losing all of the transmitted bits that depend on a particular speech bit, thus preventing that speech bit from being recovered. Further, the interleaving pattern can be chosen according to the principle explained with the aid of FIG. 1, such that the first bits out of coder 21 are placed next to (and preferably between) known bits (e.g., sync bits) and then when all such positions are exhausted, the next bit out of coder 21 is placed next to the first bit, and so-on. This type of interleaver is known as a block interleaver because a block of M.N data bits are placed into a block of M frames.

However, it can also be advantageous to employ a so-called diagonal interleaver or a block-diagonal interleaver. The block diagonal interleaver can be used with Pi/4-DQPSK quaternary modulation that carries two coded data bits per transmitted symbol, with diagonal interleaving over M=2 frames. If the two bits of a symbol are denoted "odd" and "even" bits, it can be advantageous to dispose a block of coded bits over the even bits of a first of the M frames and the odd bits of the second of M frames. Then the next block of coded bits is disposed over the even bits of the second frame and the odd bits of the next frame, and so-on.

Interleaver 22 can include a buffer memory holding one or two frames of coded speech bits and will then interleave half the coded bits of a previous speech frame with half the coded bits of a current speech frame for transmission in the current TDMA burst. Use of time division multiple access is merely exemplary and those skilled in the art will recognize that the present invention can also be used with Frequency or Code Division Multiple Access, for example. The transmitted signal can also advantageously be frequency-hopped so that the different bursts or segments over which the code bits are interleaved are on different frequencies having different, uncorrelated interferers.

Interleaved bits from interleaver 22 are converted to a waveform for transmission using a chosen modulation technique in waveform generator 23. For example, Gaussian filtered Minimum Shift Keying (GMSK) can be used where a binary 1 is encoded as a +90 degree phase change and a binary zero as a −90 degree phase change from the previous phase. In GMSK, the phase changes are gradual so as to contain the transmitted spectrum within an allocated channel as much as possible. The gradual phase changes are produced by applying a positive or negative impulse, according to the data bit polarity, to a Gaussian filter whose output is regarded as a rate of change of phase (i.e., frequency shift). This rate of change of phase is then integrated modulo-2Pi and the resulting absolute phase value converted to cosine and sine values using a look-up table in order to produce I and Q quadrature-modulating values. These are converted to analog waveforms by DtoA conversion followed by low pass filters 24. If the Gaussian filtering can be approximated with a finite impulse response filter (FIR filter) of reasonably short impulse response, e.g., 3 bit periods, then the output I,Q waveforms over each bit period depend on a past history of three bits and so are only eight in number. All eight waveforms can be precomputed and stored in a look-up table in modulation waveform generator 23 and selected for output according to the last three input bits from interleaver 22.

Alternatively, waveform generator 23 can implement a four-level modulation, such as Gaussian filtered 4-MSK, in which pairs of input bits at a time are encoded into one of the four phase changes +45, −45, +135 or −135 degrees. Such a modulator can operate according to the same principle as outlined above for producing 90 degree phase changes in the GMSK case.

A non-constant-amplitude modulation such as Pi/4-DQPSK can also be employed, in which pairs of bits at a time are encoded into vector transition from a previous I,Q vector position to a new position that is rotated ±45 or ±135 degrees around from the old position. However, transitions from the old to the new position in this case are smoothed not by applying the phase rotation gradually, but rather by filtering the I,Q waveforms using, for example, a root-raised-cosine filter as described in the U.S. T.I.A. standard IS54 for digital cellular telephone systems.

It is also possible to implement the present invention with modulation schemes having a greater number of levels than four, for example 8-DPSK or 16DQAM. Use of a differential modulation technique is not a requirement of the invention and a person skilled in the art can easily adapt the technique to the case where information is carried in a sequence of absolute phase values, such as PSK, QPSK, 8-PSK or 16QAM. Rather, the present invention permits the use of differential modulation without the usually attendant 3dB loss of performance as compared with coherent demodulation, while the analogy in the case of absolute or coherent phase modulation is that the invention facilitates resolution of the usually attendant phase ambiguity.

The I,Q modulation waveforms produced by any of the above methods are applied to a quadrature modulator composed of 90 degree phase splitter 27, balanced modulators 25,26, combiner 29 and filter 30. This circuit applies the I modulation waveform multiplicatively to a cosine carrier wave at a frequency determined by frequency synthesizer 28 and the Q waveform to a sine carrier at the same frequency. Combiner 29 forms I.cos($\omega$t)+Q.sin($\omega$t) which is the desired modulated waveform, but at an intermediate frequency $\omega$. This is then translated up to the desired transmit frequency using heterodyne mixing in upconvertor 31 with a local oscillator signal from synthesizer 28. The local oscillator frequency can be varied by a controller (not shown) to effect transmission on different desired channels.

The transmit frequency signal out of upconvertor 31 is selected by filter 32 which suppresses other unwanted frequencies, and is then amplified to a desired transmit power level in power amplifier 33. In a TDMA system, a TDMA timing generator orchestrates the timing of data flows between the different blocks and also smoothly controls the power amplifier turn-on and turn-off by means of up- and down-ramping of the power level so as to avoid spectral splatter into adjacent channels.

The I,Q modulators can be driven by balanced I,Q filters, for example, as described in U.S. Pat. No. 5,530,722 entitled "Quadrature Modulator With Integrated Distributed RC Filters" which is incorporated herein by reference. An exemplary receiver block diagram for implementing the present invention will now be described with the aid of FIG. 3.

A superheterodyne receiver comprising antenna filter 40, low noise amplifier 41, image rejection filter 42, mixer 43 and programmably synthesized local oscillator 44, 45, 56 are used to downconvert the frequency of the received signal to a suitable intermediate frequency where it can be filtered with fixed-frequency IF filter 46. An integrated circuit IF chip 48 can then be used to further downconvert the signal using a second local oscillator, which can also be synthesized with the aid of frequency synthesizer control circuit 56 and loop filter 47. The further-downconverted signal is further amplified by chip 48 and further filtered using second IF filters 49, 50. The amplified signal is then digitized using AtoD convertor 51 which can advantageously employ the logpolar technique described in U.S. Pat. No. 5,048,059 which is incorporated here by reference. Using the logpolar method, the final amplifier stage is driven to saturation so that a substantially constant amplitude signal emerges, preserving information on the radio signal's phase but not its amplitude. The amplitude information is generated separately by detectors attached to each of the internal amplifier stages in IF amplifier chip 48 so as to produce a signal approximately proportional to the logarithm of the amplitude, generally known as the Radio Signal Strength Indication (RSSI).

The phase information is extracted from the saturated output using an AtoD conversion technique such as low-pass filtering followed by quadrature sampling and AtoD conversion of the samples to obtain numerical values approximately proportional respectively to the cosine and the sine of the phase, or by use of a direct phase digitizer such as disclosed in U.S. Pat. No. 5,084,669 which is entitled "Direct Phase/Frequency Digitization" and which is incorporated here by reference. If the latter method is used, the phase value so obtained may then be converted to cosine and sine values using, for example, look-up tables. The cosine and sine value are then multiplied by the recovered amplitude signal to reconstruct the cartesian complex representation of the radio signal. The amplitude signal is recovered from the RSSI signal by means of an antilogarithm look-up table, for example.

It is sometimes desirable first to subtract a scaling value from the RSSI values, such as the greatest value in a block of signal samples (block scaling) as described in U.S. Pat. No. 5,568,518, entitled "Fast Automatic Gain Control" which is being filed concurrently herewith and which disclosure is incorporated here by reference, to ensure that the cartesian values lie within a certain range, e.g., between +1 and −1. Such block scaling and logpolar-cartesian conversion operations are performed by digital signal processing unit 53 on digitized signal samples collected in buffer memory 52. Digital signal processing unit 53 may also be programmed to perform the processing required to implement the present invention of combined demodulation and decoding. Digital signal processing unit 53 may then also implement a VSELP or RELP speech decoder to convert decodulated data to PCM speech samples, which may then be converted to an analog speech waveform using DtoA convertor 54.

Figure 4:
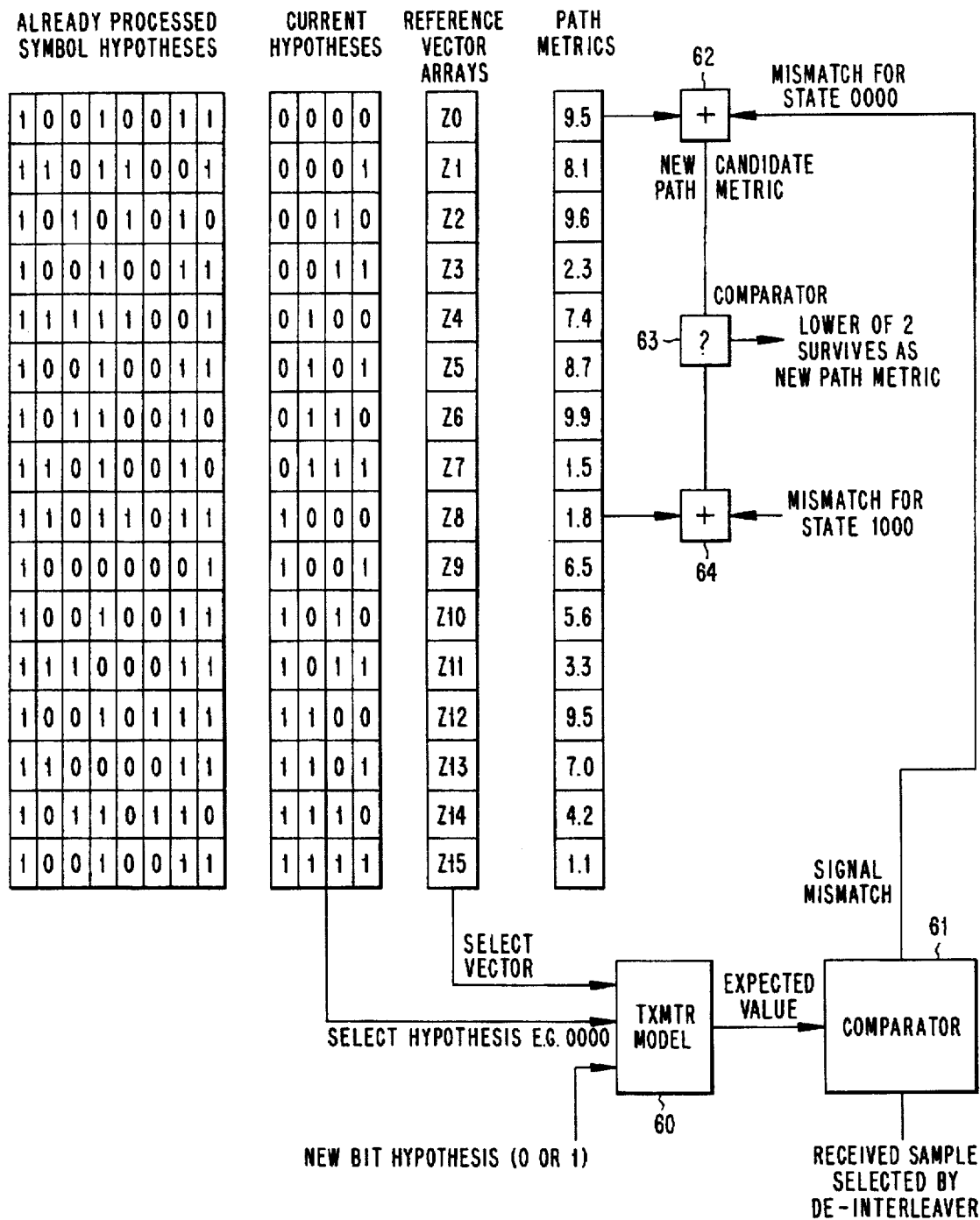
FIG. 4 illustrates more detail of the internal structure of the exemplary decodulation process implemented in FIG. 3.

FIG. 4 illustrates an exemplary implementation of a demodulator according to the present invention. Each quantity Z in the column of complex arrays marked Z0 to Z15 is a plurality of complex values, i.e., a complex vector array, with each value representing the best current estimate of the radio signal vector just prior to a signal sample to be processed. The number of Z values in each array can be equal to twice the number of known symbols included in the signal bursts being processed, in the case of differential modulation, or equal to the number of known symbols in the case of absolute phase modulation.

For example, if interleaving spreads differentially coded symbols over two TDMA bursts interspersed with six known sync symbols per burst, then the number of Z values in each array, such as Z0, is 24. The values represent estimates of the signal vector at a position to the left and to the right of a known symbol, respectively. The Z values are initialized to estimates of the vector on each side of the respective differential sync symbol. For example, if the first differential known symbol in the first TDMA burst is known to have a +90 degree rotation, and the receive signal vectors before and after this known rotation are respectively $Z(i-1)$ and $Z(i)$, then the best estimate of the phase on the left of (i.e., before) the sync symbol is $(Z(i-1)-jZ(i))/2$, and the best estimate of the signal vector on the right of (i.e., after) the sync symbol is $(jZ(i-1)+Z(i))/2$. The former is obtained by rotating $Z(i)$ backwards through the known 90 degree phase shift to align $Z(i)$ with the previous value $Z(i-1)$, and then averaging the two. The latter is obtained by rotating $Z(i-1)$ forward through the known 90 degree phase shift to align $Z(i-1)$ with Zi and then averaging the two. Later it will be described how a variable scaling of the sum, rather than simply dividing the sum by two can be beneficial. The scaling should actually result in equal noise expectation on all combined values.

Repeating this process for all known values as indicated in FIG. 1 provides starting values for the reference vectors Z. At this point, the values Z0, Z1, ... Z15 associated with different hypotheses for the decoded sequence are all the same.

Decodulation according to this exemplary embodiment now proceeds as follows. A hypothesis for a transmitted symbol sequence filling all positions in the convolutional encoding shift register is made. For example, if a constraint-length 5 code is employed, the shift register will have five stages. Selecting the row in FIG. 4 corresponding to the hypothesis 0000 and hypothesizing a new 0 bit is equivalent to hypothesizing that the transmitting encoder register contained five zeros at that point. The hypothesized shift register contents are then used to generate the encoded bits P1, P2, etc., that should have been transmitted if the hypothesis was correct. This is carried out by incorporating a model of the convolutional encoder into transmitter model 60. Transmitter model 60 also incorporates the known modulation parameters so that complex signal values representative of P1 and P2 can be predicted, as well as the interleaving or bit placement information to predict where in the TDMA signal bursts P1,P2, etc., would be expected to be seen.

The first bits P1,P2 hypothesized with the aid of model 60 are, according to exemplary embodiments of the present invention, those located adjacent to known symbols (e.g., sync symbols), and are the U bits numbered 1 and 2 in FIG. 1. In this example, U1 lies between two known symbols K and so one of the vector estimates, denoted herein ZR, in Z0 (because the current hypothesis is 0000-x) corresponds to the vector on the fight of U1 and to the left of the following known symbol and another, ZL, corresponds to the vector on the left of U1 and to the fight of the foregoing known symbol. Assuming binary modulation such as MSK for this example, in which a binary "1" is represented by a +90 degree phase rotation from one sample to the next and a "0" by a −90 degree rotation. Then if P1 is hypothesized to be a "1" it would be expected that ZR will be +90 degrees rotated relative to ZL. Therefore, model 60 selects the appropriate current vector reference, ZL from the array Z0, applies a 90 degree rotation to the vector reference, and compares the rotated ZL with, in this first instance, the best expected value ZR also from the reference array. Later on in the processing, when all unknown symbols lying between known symbols have been processed, comparison will be made with received samples selected by the de-interleaver from buffer memory 52 that lie adjacent to already processed samples.

Comparing jZL with ZR in comparator 61, the quadratic error $|Zr-jZL|^2$ is calculated. This error is the mismatch between the signal value expected if the hypothesis were true and the signal value actually received. The new mismatch is added in adder 62 to any existing cumulative mismatch (i.e., the path metric) associated with that hypothesis, the path metrics having initially been set to zero, to find a new cumulative mismatch or path metric. The above process is repeated for P2 for rate ½ coding, which results in two bits being transmitted for every information bit. Similarly, this process is repeated for P3, P4 etc., if the coding rate is ⅓, ¼ or lower, taking account of where earlier unknown values were placed by the interleaver and of their nearest vector references. For example, P2 according to FIG. 1 is placed in TDMA burst 2 and corresponds to the U bit labelled "2". Its mismatch is calculated analogously to that for P1 but using the elements of vector reference array Z0 calculated from the known symbols K on either side of U2.

The new path metric is at this point regarded as a candidate value for a new state/hypothesis 0000, as the hypothesis 1000 followed by a new bit 0 is an equally possible candidate. When the convolutional encoder shifts its encoding register one place to the left, the leftmost 1 or 0 will move out of the register leaving in both cases 0000 in the four leftmost positions. Thus, a candidate metric is calculated in the same way as above, but starting with the hypothesis 1000-0 and using as its corresponding reference vector the Z-values from Z8. The second candidate metric from adder 64 is then compared with the first from adder 62 in comparator 63 and the lower of the two is selected. If the lower value comes from adder 64, then the hypothesis 1000-0 is deemed to be a better hypothesis than 0000-0, and state/hypothesis 1000 is called the "best predecessor" to new state 0000. The contents of the "already processed" memory associated with the best predecessor are then selected to be the contents of the already processed symbol memory of new state 0000, and a "1" or a "0" is left-shifted in from the right hand side of this memory depending on whether the best predecessor was 1000 or 0000, respectively. The lower of the candidate metrics also becomes the new path metric, and the reference vector array associated with the best predecessor is selected to be the reference vector array for the new state, after updating. The selected reference vector array is updated as follows.

Suppose the best predecessor gave a prediction for P1 of binary 0, corresponding to a phase rotation of −90 degrees assuming, for example, MSK modulation. Then the signal vector on the right of U1 should be −90 degrees rotated relative to the signal vector on the left. In fact, in the special case of an unknown symbol sandwiched between two known symbols such as U1, the sequence KUK consisting of complex signal samples Z(i−2) to the left of the first K symbol, Z(i−1) between the first K symbol and the U symbol, Z(i) to the right of the U symbol, and Z(i+1) after the second K symbol is now known. For example, if the first K symbol is an MSK "1", i.e., a +90 degree phase rotation, and the second K symbol, like U1, is a −90 degree rotation, then the following relationships should hold:

$$Z(i-1)=jZ(i-2)$$

$$Z(i)=-jZ(i-1)=Z(i-2)$$

$$Z(i+1)=-jZ(i)=-Z(i-1)=-jZ(i-2)$$

Thus a better estimate of Z(i+1) (to the right of the second K symbol) is:

$$Z'(i+1)=(Z(i+1)-jZ(i)-Z(i-1)-jZ(i-2))/4 \qquad (1)$$

Then it follows that better estimates of the other values are simply:

$$Z'(i)=jZ'(i+1); \ Z'(i-1)=jZ'(i); \ Z'(i-2)=-jZ'(i-1)$$

The corresponding elements in the array, e.g., Z8 if 1000 is best predecessor or Z0 if 0000 was best predecessor, are thus updated to the new values before becoming the new Z0 reference vector array for successor state 0000.

Repeating the above process for a new bit hypothesis of "1" instead of "0" generates a new state 0001 in the same manner. Repeating the above starting with, in turn, pairs of hypotheses 0001-1001; 0010-1010; etc. then generates the rest of the new states so that there are at the end of one iteration the same number of new states (16 in this example) as at the beginning.

The above procedure is used to process sequentially the received samples in the order as labelled in FIG. 1, namely U1,U2... etc. It can be seen that this exemplary process deliberately processes samples that lie in between two known symbols before other samples, however this is only one possible arrangement. When symbols lying in these positions have been exhausted, as occurs, for example, after symbol number U12 in FIG. 1, the first hypothesized data bits will have moved a number of positions from right to left to enter the "already processed symbol" memory and become more or less firmly determined. If, for example, a corresponding symbol in the same position in all memories agrees, then it is firmly decided. The longer a symbol has survived in its right to left passage, the greater the chance that corresponding symbols will agree, due to the continual overwriting of the memory contents by the best of two possible predecessors. In the same way, the vector references computed using that symbol hypothesis will have become more certain, so that the reference value that will be used in processing U13, which derives from already processed values of U1,U5,U9 and four known symbols K, will have survived for the last twelve processed symbols and thus have a lower probability of being incorrect. In this way, the vector reference used to decode the symbol U13 contains less uncertainty due to noise than had it been based on the single K symbol to its right. In the same way, the vector reference used to decode U14 in TDMA burst 2 derives from already processed symbols U2,U6,U10 and the four K symbols in burst 2, and so-on for signal samples up to U20.

At this point there are no further unknown symbols lying next to known symbols, but symbol U21 lies to the left of already processed symbol string (reading left to right in burst 1) U13,K,U1,K,U5,K,U9,K,U17. Thus, a vector reference exists in each state that is based on the previous hypotheses made to arrive at that state. If the hypotheses are true, the vector reference will be accurate, leading to an accurate prediction of U21, and thus a small addition to the path metric when processing U21. If, on the other hand, the hypotheses contain errors, the vector reference will not be so accurate, U21 will not be predicted so accurately, and a greater quadratic mismatch will be added, reducing the probability that that state will survive as a "best predecessor".

Conventional differential decoding normally suffers an approximate 3dB loss due to the reference vector having an equal amount of uncertainty due to noise as the signal sample being processed. Using the inventive demodulator described above, this loss is largely avoided as the reference vector is based on a number of already processed signal values whose uncertainty has been reduced by the convolutional decoding. Intelligent choice of the interleaving pattern such that a next symbol to be processed lies adjacent to an already processed symbol allows progressive extension of the decodulation process to any number of unknown symbols while preserving the advantage of reduced noise. It is desirable but not essential to begin decodulation by processing unknown symbols that lie next to known, e.g., sync symbols, as the reduction of noise for these symbols is obtained upfront.

One of the objects of the present invention is to facilitate a differential modulation technique that is less sensitive to time-variation of the channel than the alternative, coherent demodulation technique. If the channel varies rapidly, over the space of a few symbols, some modification is needed to the method of updating the vector references to take account of the fact that the assumed vector relationships expressed in equation (1), for example, may be inaccurate. Due to multipath fading, the propagation loss and phase shift through the radio channel will change with time so equations such as (1) should be modified to allow some form of exponential forgetting and/or incorporation of derivated estimates.

A derivative estimate may be incorporated, for example, by assuming that the channel propagation loss changes by dA nepers per symbol (i.e., the received amplitude will be higher by the factor EXP(dA) one symbol later) and that the phase changes by dTHETA per symbol. These assumptions can be combined by saying that the channel one symbol later will be modified by the complex multiplying factor Q=EXP (dA+jdTHETA). Equation (1) should then read:

$$Z'(i+1)=(Z(i+1)jQ.Z(i)-Q^2.Z(i-1)-jQ^3.Z(i-2))/4 \qquad (2)$$

It may also be desirable to include further amplitude weights in the above combination to weight the more strongly received samples higher than the less strongly received samples, and the derivation of such weights to maximize the signal to noise expectation on the result will be derivable by those skilled in the art and, accordingly, are not further discussed herein.

A suitable value of Q may be calculated for each state and stored alongside the corresponding reference vector array values for that state. The value of Q for a state is estimated by assuming the already processed symbols in that state and the current hypothesis to be true. The nominal vector rotations expected for those symbols can then be removed leaving unmodulated values that depend only on the variation due to the channel.

The exact method of determining the channel variation is not material to the present invention, and could, for example, include best fitting a uniform drift rate to the phase, low-pass filtering the unmodulated values using a filter of bandwidth only sufficiently wide to pass the maximum expected Doppler frequency, or Kalman filtering.

Figure 5:
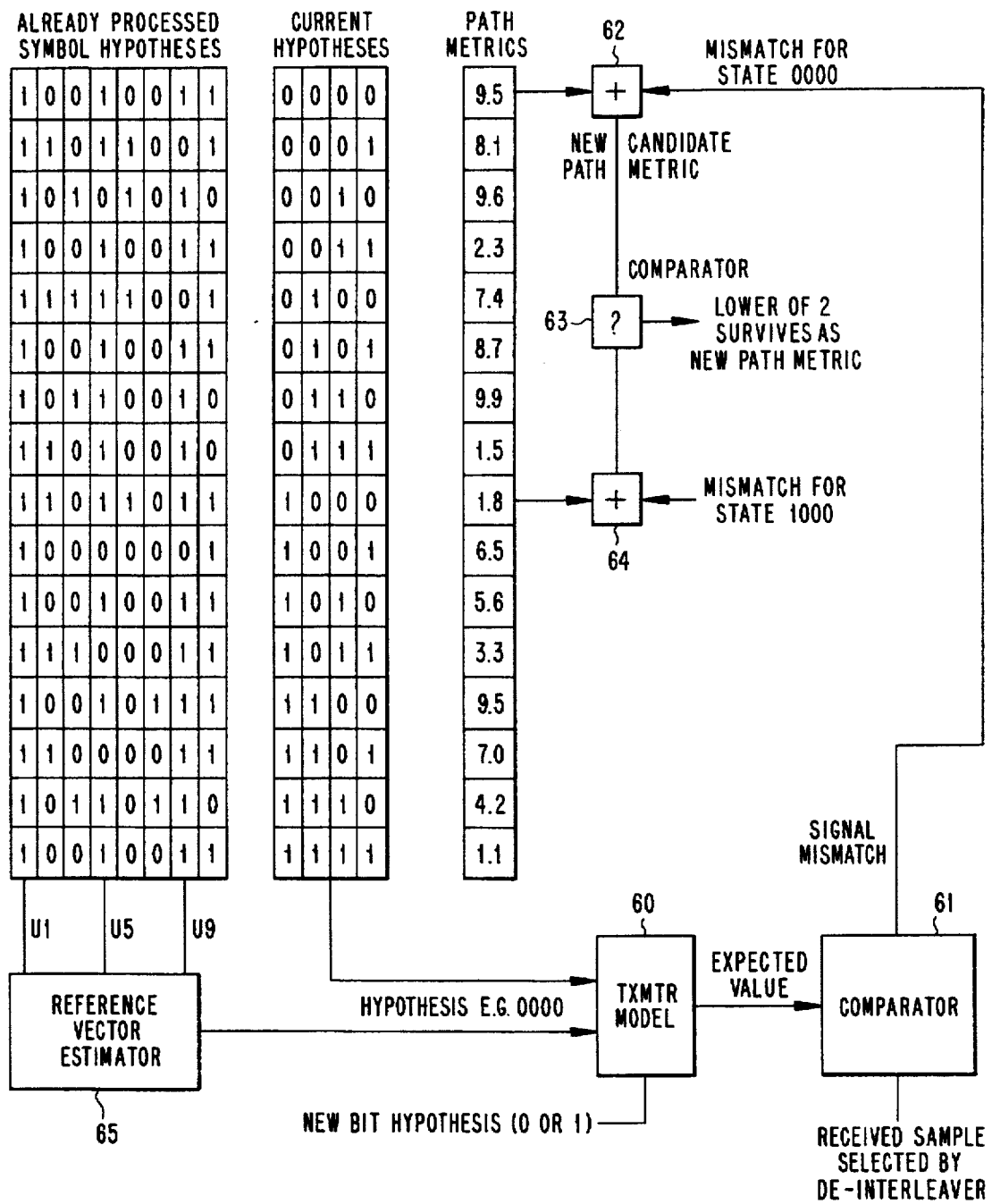
FIG. 5 illustrates a modified internal structure to compute reference vectors on the fly.

Another exemplary embodiment of the present invention avoids the step of storing and updating reference vector values by computing them "on the fly". FIG. 5 shows an exemplary modification to the block diagram of FIG. 4 for this embodiment.

Referring to FIG. 5, reference vector estimator 65 has been added as compared to FIG. 4, and the column of reference vector arrays has been removed. In the foregoing example of operation, decoding of unknown symbol U13 was to be performed with the aid of a reference vector derived using already processed symbols U1,U5 and U9 as well as some known symbols. For simplicity's sake, reference vector estimator 65 is shown obtaining already processed symbols U1,U5 and U9 from the "already processed symbol" memory, although this memory does not necessarily contain U1,U5 and U9 but rather decoded symbols. Using rate ½ convolutional coding for example, the "already processed symbols" can contain only half as many decoded symbols as coded (U) symbols. Nevertheless, using a model of the transmitter's encoder, the coded (U) symbols can be reconstructed from the decoded symbols. Alternatively, this recoding can be performed continuously so that the required U values are stored in the "already processed symbol" memories. As well as the U values, reference vector estimator 65 uses the corresponding received sample values. These are not shown as being applied to block 65 for simplicity, but can, for example, be stored in a 17th row of the symbol memory underneath corresponding U-symbols. The estimator 65 forms the reference vector estimates by rotating signal samples using a corresponding U symbol to determine the direction and amount of rotation, and then forming a weighted sum, including any signal samples related to known sync symbols encompassed. The weights used can reflect progressive exponential forgetting of older values to account for the time-variation of the channel.

Some of the concepts used in exemplary decodulation systems and methods according to the invention have individually been given names which will be recognized by those skilled in the art. If for example, a U-value used to compute a reference vector estimate is based only on symbols in the section marked "current symbol hypothesis", all possible hypotheses within this section are still open and that U-value forms part of the sequential maximum likelihood estimation process of the machine. Such a U-value is accordingly commonly referred to as "maximum likelihood tap" or "Viterbi tap" on the symbol memory regarded as a shift register. If a U-value used to compute a reference estimate is taken from the far left of the symbol memory, where all corresponding hypothesized symbols have converged to a single decision, it is termed a Decision Feedback tap (DFE tap). If, however, the U-value is taken to the left of "current symbol hypotheses" but to the right of the point where symbol values have converged to the same value, it is termed a "post survivor" tap and its use is termed "per-survivor processing" to indicate that each hypothesis or state has a different "post survivor" entering into the current metric calculation. The systematic combination of Viterbi taps, DFE taps and Post Survivor taps are used, as described above, in exemplary embodiments of the present invention to compute reference vectors for differential demodulation and decoding.

An alternative manifestation of the invention will now be illustrated with the help of FIG. 6. FIG. 6 illustrates the disposition of a first block of data bits a1,a2,a3 . . . between two transmitted blocks A and B. The odd bits a1,a3,a5 . . . are disposed in a first transmitted block A between even bits x2,x4,x6 . . . of a previous data block. Even bits a2,a4,a6 . . . are disposed between odd bits of a data block b1,b2,b3,b4 . . . in a second transmitted block B. The remaining, even bits of the data block b1,b2,b3 . . . are disposed in a third transmitted block between odd bits of a new data block c1,c2,c3 . . . and so on.

The data bits x1,x2,x3 . . . a1,a2,a3 . . . b1,b2,b3 . . . c1,c2,c3 . . . are the sequential output bits of an error correction coder of the aforementioned type, e.g., punctured convolutional coder. The bits are modulated on to a radio frequency wave by a differential phase modulation technique of either constant or variable amplitude, such as GMSK, DPSK, DQPSK etc. to produce complex vector waveforms for transmission having sample values z1,z2,z3 . . . at data-symbol-spaced intervals. Thus the symbol a2 in FIG. 6 is encoded into the phase change between vector sample z1 and z2, the symbol b2 is encoded into the phase change between vector sample z2 and z3 etc.

Decodulation of this format proceeds according to this exemplary embodiment of the invention as follows. Assume the previous block of bits x1,x2,x3 . . . has been passed through the error correction coder and been decoded. Assume furthermore that correct decoding has been verified to a high probability by use of an error detection technique such as testing a deliberately inserted cyclic redundancy (CRC) code. Then the bits x2,x4,x6 . . . in transmitted block A are known. Since x2 is known, the phase change from complex sample u1 to u2 is thus known, and received vector value u1 can be rotated forward by this known phase change to align u1 with u2. The two are then added to obtain a better estimate of the vector at the start of differential symbol a1.

Likewise, because x4 is known the differential phase between u3 and u4 is known, allowing received sample u4 to be rotated backwards through this known angle to align and add it with u3 thus obtaining a better estimate of the vector u3 at the end of symbol a1. Using these improved estimates of the vector on either side of a1 allow a1 to be decoded with a gain of, for example, 3dB, i.e., the normal differential loss is compensated by this 3dB gain such that the odd symbols a1,a3,a5 . . . are as reliably decoded as if the process was a coherent modulation and demodulation process. Unfortunately, this gain is not yet available for the even numbered symbols a2,a4,a6 as their neighbors b1,b3, b5 . . . are not yet decoded. However, half of the symbols a1,a3,a5 into the error correction decoder will have been estimated by the more reliable method while alternate symbols a2,a4,a6 will exhibit the normal differential performance. The result is that the data block a1,a2,a3,a4 . . . will be decoded with a reliability approximately half way between that of coherent and differential modulation and demodulation. After decoding the block, it is in turn submitted to the error detection test to determine if it can be considered a known block for the purpose of decoding the bits b1,b3,b5 etc.

Figure 7A:
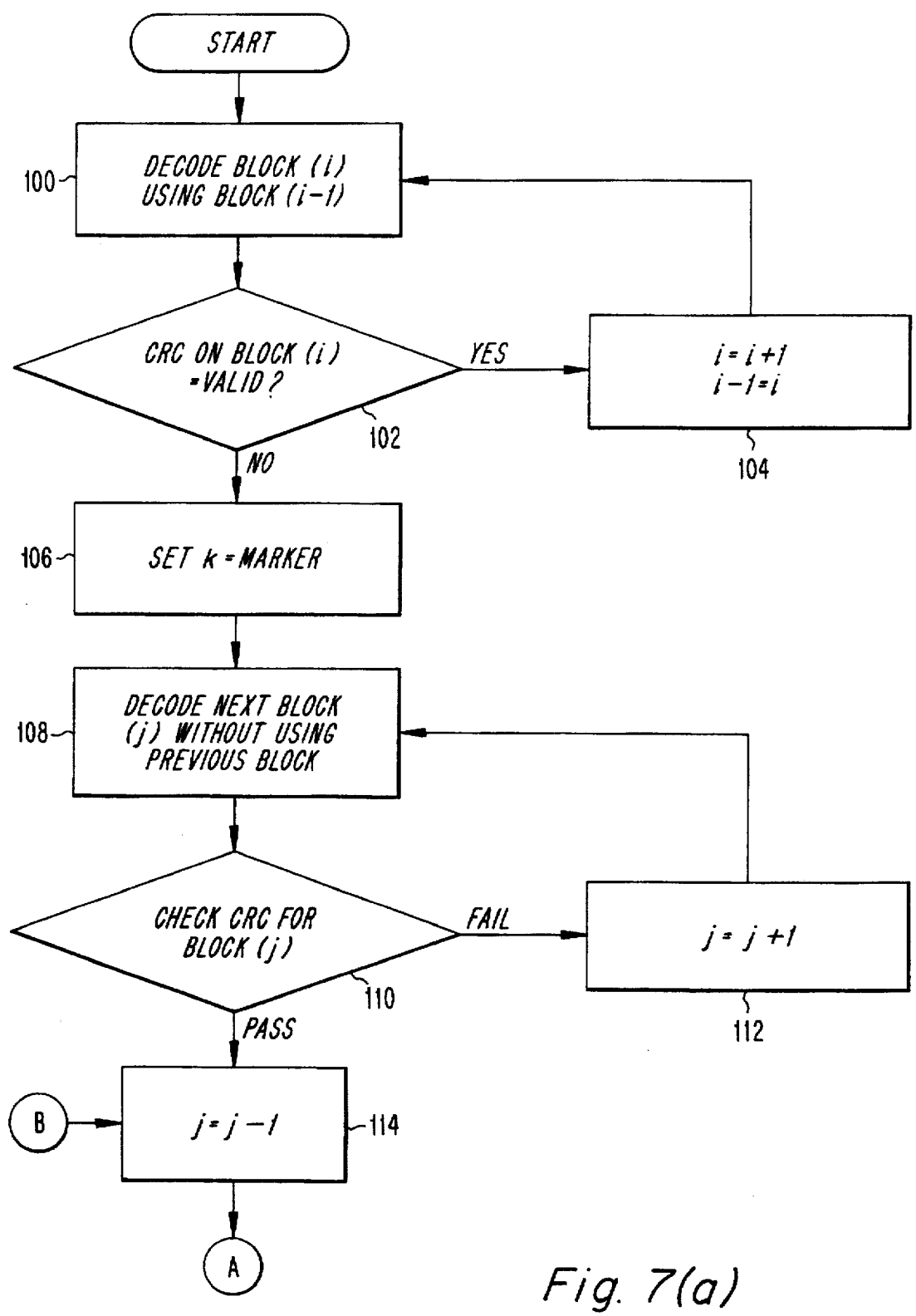
FIGS. 7(a) and 7(b) provide a flow chart illustrating an exemplary multiple pass method according to the present invention.
Figure 7B:
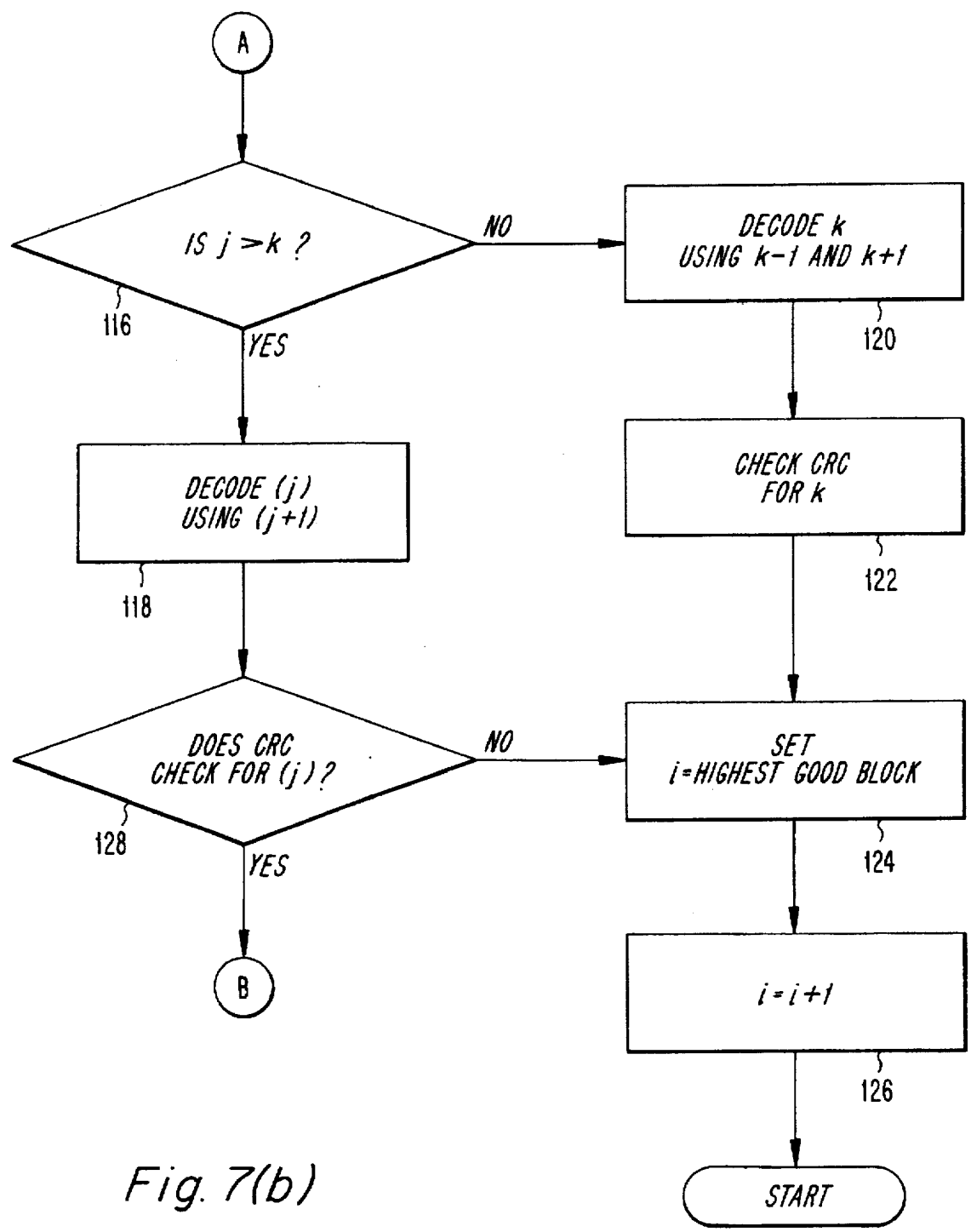

According to another exemplary embodiment, the "a" bits can be decoded after the "b" bits have been decoded. At that time, the even bits "a" will also be surrounded by known bits b1,b3,b5 . . . so that the more reliable decoding method describe above is available for both odd and even bits of "a" , and a full 3dB improvement in performance is achievable by such retrospective or "multiple-pass" demodulation. Note that this process can be extended iteratively so that a two-pass demodulation technique decodes "a" bits again after decoding "b" bits, and a three-pass demodulation technique decodes "b" bits again after decoding "a" bits for a first time, and then "a" bits from a third time after decoding "b" bits for a second time, etc. If a CRC error detecting code is employed on the entire data block, it may be worthwhile to repeat demodulation for only those blocks of bits that failed the CRC check on a prior occasion. Thus an exemplary flow chart for a multi-pass decodulation process is illustrated in FIG. 7.

The entry point to step 100 is when a previously decoded block has passed the CRC check. The next block may thus be decoded making use of the previous block which is now known. If the new block also passes the CRC in step 102, then at block 104 the new block simply becomes the previous block and the algorithm process returns to step 100 to decode the next block.

If, however, the CRC check fails in step 102, then the block number (k) at which the failure is detected is set to a maker variable at block 106. Note that the previous block to block number (k) passed the CRC. In step 108, the next block (j) is decoded without the benefit of previous block (j−1) (which equals k for the first iteration) being known. Then it is determined at 110 whether block (j) decoded properly. If block (j) does not decode properly, j is incremented in step 112 and the next block is decoded at 108. When ultimately a block (j) is decoded correctly, then the prior block j−1 is decoded by decrementing j in step 114. If the prior block (j) is not the originally detected bad block (k) as determined in block 116, there is a preceding bad block (j−1) so the prior block (j) can be decoded with the benefit of the subsequent block (j+1) being known, but not the preceding block (j−1), in step 118. If on the other hand variable j is detected to have returned to the number k of the original, first-detected bad block in step 116, then a branch to step 120 occurs in which the original bad block(k) is decoded with the benefit of both the following and preceding blocks being known, and thus a full 3dB gain is available to give a higher probability of correct decoding the second time through this process. Whether or not the CRC on block(k) checks in step 120, no further improvement may be expected and in steps 124 and 126 the algorithm now jumps ahead past the highest block correctly decoded to date and returns to step 100.

Likewise, in block 128 if a previously bad block decoded again with the help of a now known following block shows no further improvement, then the algorithm skips ahead to block 124 and then ahead past the highest numbered correctly decoded block and returns to step 100.

It will be appreciated that use of a CRC check is simply an exemplary criterion for determining if a decoded block can be used to assist decoding a following block or redecoding a previous block, or for determining if a previously decoded block need be redecoded at all. Other criteria can be used, however, such as the path metric growth over a block. If the path metric growth, being the difference between the best path metric at the start of decoding a block and the best path metric at the end of decoding a block is within a first threshold, the block can be deemed to have been well enough decoded to be considered to represent known data for assisting decoding of another block. If the path metric growth is outside a second threshold, the block can be deemed worth decoding again if a subsequent block's path metric growth lies within said first threshold. Any criterion of decoding quality assurance can be employed, such as the two exemplary methods described above.

The use of Cyclic Redundancy Check Codes is adequately known by those skilled in the art without detailed description here. CRC checks generally involve computing a check word or syndrome that should consist of all zeros if no error is present. Certain non-zero syndromes can correspond to correctable errors, for example single bit errors. Whether such further error correction capability of CRC codes is exploited or not is optional. The CRC check can be deemed correct for the purposes of the above algorithm if either the syndrome is zero or if it is equal to a value corresponding to a correctable error pattern, if error correction by the CRC is implemented.

In the above description, it is assumed that the error correction decoding after each stage reaches a conclusion at which point a CRC check can be performed. If the error correction coding/decoding is block coding, or convolutional decoding with tail bits or using the technique of tailbiting in order to reach a definite decoding conclusion for each block, then the CRC may indeed be checked on the results. On the other hand, using continuous convolutional coding with each subsequent data block following the previous block sequentially into the encoder, the decoder does not reach a conclusive result when the last transmitted bit that depends on an encoded data bit has been processed. At that point, a convolutional encoder typically contains a number of candidate result sequences that represent the best result for each possible combination of a number of as-yet incompletely decoded following bits. Only when a further block containing more clues on these following bits has been processed will the most likely candidate become apparent. It is, however, undesirable for the receiver to have to wait for further data before being able to process a CRC check on the previous block since this can delay output from the demodulator causing undesirable speech delay in a digital speech transmission system, for example. Tolerable delay is a factor in describing how much depth the retrospective decoding described in FIG. 7 can be taken to, therefore performance also depends on minimizing unnecessary processing delays.

On the other hand, one of the available candidate sequences will be selected, and since these are finite in number and all stored within the history memory of the Viterbi decoder, a CRC check can be performed on all candidate sequences. This can be achieved as follows. The CRC check is first performed on the Viterbi state history memory having the best associated path metric. If the CRC checks, the history memory contents can be regarded as the definitive result and are output to further processing (e.g., a voice decoding algorithm or DtoA convertor). The result may also be taken as the known bit sequence to assist decoding of the next block.

Alternatively, if the CRC did not check, then the state having the second best metric is checked, and so on, until a state passing the CRC is found. With continuous convolutional decoding, this results in a single starting point with which all Viterbi states are initialized before beginning to process the next block. That is, the history memory and metrics of all states are set to the value of the candidate that passed the CRC check. If no candidate passed the CRC check, the frame is labelled as bad according to the flow chart in FIG. 7 and then either the data from the state having the best metric is output for further processing, or an erasure indication is provided if it is not possible to wait for a longer delay. In the latter case of course, there may be no point in retrospective decoding of a bad frame again since retrospective or two-pass decoding is particularly useful when it is permissible to wait until at least some new transmitted data is received.

However, even if retrospective decoding is not useful, the early CRC check can be useful in limiting the starting states of the decoder for decoding the next block to those passing the CRC. Thus, according to an exemplary embodiment of the invention a CRC check is performed on all states and those that do not pass are discarded, unless none pass the CRC check, in which case all may be retained as starting states for respective Viterbi states of the next decoding cycle. A simple method of discarding a state is to set its path metric to a "bad" value, e.g., to a very high value, which ensures that it will not be selected as a "best" predecessor to a successor state. Thus, if any state passes the CRC, the path metrics of those that do not pass the CRC are set high. If no state passes the CRC, then their path metrics are accepted unmodified as the starting points of the next decoding cycle.

Yet another variation modifies the decoder sequence such that only states passing the CRC check can be finally produced. If the number of CRC check bits is N for example, then the decoder sequence is modified after only M-N of the output bits of that block have been produced. At this point, the linear constraints the CRC represents can be used to calculate, for each state, what the remaining N bits must be in order for the CRC to check. Thus, if the next bit for state 0000 must be a 1, that state cannot be a predecessor for new state 0000, only for new state 0001. If state 1000 must also have a next bit equal to 1, then it cannot either be a predecessor to new state 0000, only to new state 0001, so there is no possible predecessor to new state 0000 and it will not be produced. In general, it is not possible to say how many final states that pass the CRC will be produced, but there will always be at least one. Those that are not produced are those that would not have passed the CRC. The result produced in this case is not the same as allowing the process to continue to the end of a block and then discarding the states that do not pass CRC. This is because, in the latter method an incorrect state 0000 may have survived a correct state 1000 as a predecessor to a subsequent state 0000 or 0001 due to the incorrect state inadvertently having a better metric. In the alternative, the decoder accepts only the worse metric because accepting the better metric would produce a sequence that could not pass the CRC check.

Thus, the above exemplary embodiment of the invention can be used to provide improved performance when decoding an error-correction coded and differentially-modulated signal. This exemplary embodiment is not based upon inserting explicit known symbols in the transmitted signal with which to assist estimating the phase and amplitude variations of the channel. In the former method however, where explicit known symbols are inserted, these may be used as described to estimate the RF vectors on one or other side of an unknown symbol and thus to improve reliability of decoding unknown symbols. When an adjacent unknown symbol is decoded, it together with previous known or decoded symbols may be used to estimate the rate at which the radio channel is changing in phase and amplitude (or in Cartesian complex value) and thus to assist in predicting the radio channel effect on the expected values of a next-to-be-decoded sample.

Although several exemplary methods have been described above for concluding decoding of a data segment and performing an error check before proceeding, the methods according to the present invention may also omit the error check and avoid reducing the just decoded block to a single candidate. Since each state of the decoder after processing all the "x" bits, for example, is a possible candidate for the "x" result, these can all be retained and used as "post-survivor" inputs for continuing to process the "a" bits. The use of a CRC is thus optional.

Methods for updating the channel models from the received signal are as described for example in Swedish patent application number 90850301.4. These methods maintain a separate channel model for each Viterbi state. When one of a number of possible predecessor states is selected to survive as the best predecessor to a new state, the channel model belonging to the survivor is updated to become the channel model for the new state. In this way it is ensured that the surviving channel models were always derived from the best demodulated data sequences to date.

U.S. patent application Ser. No. 07/894,933, entitled "Adaptive Maximum Likelihood Demodulator" and filed on Jun. 8, 1992, by the same inventor and commonly assigned, is incorporated herein by reference and describes a variation of the adaptive Viterbi equalizer that does not employ channel models to generate the predictions, except perhaps for initial start-up, and no updating of channel model parameters is thus employed. Instead, that variation employs direct updating of the signal predictions for each state without going through the intermediate step of first updating a channel model.

Commonly assigned U.S patent application Ser. No. 07/965,848 entitled "Bidirectional Demodulation Method and Apparatus" filed on Oct. 22, 1992, describes a method of minimizing loss of intervening data when a temporary signal fade causes loss of one of the training patterns. Intervening data can be demodulated not only forward from a training pattern, but also backward from the next training pattern by first storing received signal samples in a memory and then time-reversing the sequence, and to make quality estimates of demodulation in each direction to determine how many data symbols shall be decoded by forward demodulation and how many by backward demodulation.

It should be noted that the present invention is applicable both to forward decodulation from known "training" symbols and backward decodulation, but the direction is not contingent upon signal quality but is determined by the chosen interleaving pattern, as discussed in relation to FIG. 1 where the order of processing was from right to left from $U_{13}$ but from left to right from $U_{17}$, according to the fixed interleaving pattern and not variable in dependence on signal quality. Indeed an advantage of the present invention is that direction of demodulation is no longer an issue since the demodulation process is integral with the decoding.

All the above methods can be employed, for example, with convolutional coding of constant rate (e.g., rate ½ or rate ⅓) or with punctured convolutional coding of variable rate. In the latter case, some data bits may not be coded at all, for example if their perceptual significance in affecting the quality of a digital voice transmission is not high. When certain bits are not protected by error correction coding, their certainty is not improved by decoding and so they cannot be considered to be known symbols in later processing of neighboring symbols. It is desirable, therefore, to be able to improve decoding of a subsequent block using only those symbols protected by error correction. This can be achieved according to another aspect of the present invention in which the differential modulation process is modified to "skip" uncoded symbols. This is illustrated in FIG. 8.

In FIG. 8, the link from u4 to symbol a3 and from z4 to symbol b3 is missing as compared to FIG. 7. Instead, a3 is encoded in the phase difference between vector u2 and u5 for example, and b3 is encoded in the difference between vector z2 and z5. In this way, uncoded symbols x4 and a4 are not needed when decodulating coded symbols a3 and b3, respectively. Instead, the combination of vectors u5 and u6, made with the help of already known symbol x6, is compared with the combination of u1 and u2, made with the help of already known x2. Symbol a3 is thus decoded without needing x4 to be known, and x4 may thus be an uncoded bit that is "skipped over" by the process that decodes x1,x2, x3,x5,x6 etc. Later, a better estimate of the uncoded x4 bit may be produced after at least the bit a1 is known. In this way, a gain even for uncoded bits is produced, while preventing the greater uncertainty of uncoded bits degrading the error rate of coded bits.

It is also permissible for a3 to be encoded in the vector difference between u3 and u5, skipping the less certain u4. Then a known a1 is used to decode a3; this however, is an example of "per survivor processing" already mentioned, in which a separate hypothesis of the a1 bit is available in every Viterbi state and used when processing an a3 hypothesis for the respective state.

For example, consider processing the hypothesis that a state 1010 is followed by a new a3=0. The four bits 1010 represent, for that state, hypotheses that x(n−1)=1; x(n)=0; a1=1 and a2=0. Thus, in predicting the value of the complex vector u5 that should be received if a3=0, an improved u3 value is computed assuming that a1=1 is as given in this state, and by rotating the previously improved u2 value forward through the known phase angle for a1=1 to align and add it with the received value of u3.

In the above example, the interleaving pattern was such that the required a1 value was still only a hypothesis available separately for each state, thus it represents a "maximum-likelihood" or "Viterbi" tap, while other interleaving patterns can be envisaged such that a1 had long since passed out of the hypothesized region of the history memory (the state number and into the "post-survivor" region, in which case using a1 to help process a3 would have represented a "post-survivor tap". Using the x values, which have long since been decoded, to assist in decoding the "a" symbols, represents "Decision Feedback Taps".

The above decodulation processes can also be used to compensate for time delayed echoes in the radio propagation path by estimating the amplitude and phase of echoes delayed by one or more symbol periods and using the estimated echo values in predicting complex samples that should be received for a given symbol sequence hypothesis contained in the Viterbi state path memory. The technique whereby estimates of echo amplitudes and phases are used to help improve prediction of received values and thus reduce errors due to echoes has been amply described in the disclosures describing channel updating and signal prediction updating referred to above and need not be further elaborated here.

According to another exemplary embodiment, a method exists for improving the demodulation of uncoded bits by providing a second pass process after demodulating and decoding error-correction-coded bits. This exemplary embodiment of the present invention is even applicable when the interleaving pattern is not specifically chosen to facilitate combined demodulation and decoding, but retains separate demodulation and decoding processes. For example, a first demodulation process for demodulating Pi/4DQPSK in the presence of time-delayed echoes may be executed according to the techniques disclosed in U.S. patent application Ser. Nos. 07/894,933 and 07/965,848 which have been incorporated herein by a previous reference.

Soft decision values from such an equalizing demodulator can then be de-interleaved to assemble values representative of coded bits in presentation order to an error correction decoder that corrects errors on coded bits. The de-interleaver omits or skips uncoded bits that are not needed by the decoder.

After decoding, and optionally CRC checking, the now more reliably known decoded bits are used with a model of the encoding process to give the coded values as transmitted. These coded values were interleaved with the uncoded bits for transmission, and originally demodulated using the exemplary Viterbi equalizer of the aforementioned disclosure. According to this exemplary embodiment, a second-pass demodulation operation is now performed using the same Viterbi equalizer, but constraining the states through which it passes to accord with the already decoded bits. Computer simulation shows that this provides similar performance gains to the previously described decodulation technique. An uncoded bit bordered by two coded bits that are now known benefits through the Viterbi path collecting information on the uncoded bit as it passes through the now known previous symbol and the now known following symbol. The greater the run-length of decoded symbols surrounding an uncoded symbol, the greater the gain will be for the uncoded symbol.

This exemplary embodiment of the present invention can also be applied to quaternary modulation in which the interleaving pattern and coding operations are such that one of the two bits of a quaternary symbol is already decoded during demodulation of the other, the trellis constraints then applied reducing the number of paths from already decoded symbols from four to two with commensurate benefits, or can be applied when one of the two bits of a symbol is a coded bit and the other is an uncoded bit.

As with any digital data receiver employing coding and interleaving, it is necessary to synchronize signal sampling at the receiver so that, for example the signal samples corresponding to even and odd transmitted symbols may be correctly identified. Synchronization is facilitated by the inclusion of known (e.g., sync) symbols interspersed between information symbols at a known location in transmitted signal segments. If such known symbols are differentially modulated on to the radio frequency carrier by, for example, applying a defined phase change over the symbol interval, these known symbols may be detected irrespective of the absolute phase of the channel. In the case where information symbols are carried by absolute vector modulation (e.g., coherent phase shift keying) it is necessary to utilize groups of at least two known symbols to provide the facility to detect them independently of channel phase. A group of N consecutive coherently modulated sync symbols may then be treated as a group of N-1 differentially modulated symbols.

When symbol periods are long compared to time dispersion or echo delays experienced on the propagation path, the optimum receiver sample timing does not vary more than a fraction of a symbol period from one signal segment to the next, so it is only required to obtain a long term average sample timing averaged over many signal segments. The known symbols over many signal segments may thus all be used to determine an optimum receiver timing. For example, if each signal segment comprises 136 information symbols and 8 dispersed, isolated and differentially modulated known symbols, then determining an optimum timing over a moving window of 16 such signal segments will employ in total 128 known symbols. The preferred method of determining the optimum timing is to first obtain an initial timing at the start of communication using signal segments filled with known symbols to facilitate rapid synchronization, then to maintain synchronization by performing a test for a small number of nearby timing positions on either side of the nominal position, spaced for example at 1/8th symbol period intervals. The test can be performed by computing the differential symbol value $Z(i)Z(i-8)^*$ for the tested timing position i through the signal segment (assuming 8 samples per symbol), rotating this complex value through the inverse of the angle expected for the known symbol to align it with the real axis, and accumulating the rotated values in a histogram bin corresponding to i. The timing position i may, for example, take on values from −8 to +8 with respect to a nominal timing position, i.e., +/− one symbol period. The histogram bin which accumulates the largest value indicates the sample timing i that should be used. The histogram bins may be made leaky so as to exponentially forget the influence of old received signal segments to permit adaption of the timing to changes due to relative movement of the transmitter and receiver, or to relative reference clock errors.

It is also possible with extra signal processing effort to check and maintain synchronization without the use of known symbols, using conventional clock-reconstitution techniques. This technique can be combined with a means to reacquire frame sync if decoding starts frequently to fail. For example, decoding can be attempted for more than one postulated timing position and if a previously preferred timing position begins to give frequent decoding failures while a neighboring timing position gives successful decoding, then the neighboring timing position becomes the preferred timing position and the sample timing is recentralized around the new preferred timing.

It is seen from the above that the receiver preferably takes samples at a fraction of the symbol spacing, for example eight samples per symbol period, and that a synchronization algorithm determines which of the eight sample phases to use in selecting one sample per symbol for decoding.

Two other variations can be mentioned. It is possible to use more than one sample per symbol in the combined demodulation and decoding process by extending the maximum-likelihood algorithm to use the prediction mechanism to predict not only one received waveform sample per symbol for a hypothesized symbol sequence, but two or more samples per symbol of the expected waveform. The metric calculating means then computes a mismatch between all predicted and observed waveform samples and accumulates them. It is clear that if several samples per symbol are included in the decodulation process, performance will not be sensitive to exact sample timing.

A second variation that is insensitive to sample timing uses only one sample per symbol. If the transmitted modulation is a constant envelope modulation such as GMSK or 4-CPFSK then the energy of the sample received will not depend on the selected timing. However, the dependence of the sample on the previous and coming symbol depends on the timing. The received waveform can either be sampled at positions where the sample values will depend primarily on single symbols, i.e., in the middle of symbols, or at another extreme can be sampled at positions where the samples will depend equally on two neighboring symbols, i.e., in between said two neighboring symbols. The performance of a maximum likelihood algorithm that predicts received samples based on all symbols they depend on performs approximately equally well with all sample timings, even when only one sample per symbol is used. The symbols on which a sample primarily depends should, however, preferably represent ML taps rather than DFE or Post Survivor taps, to ensure that all possible combinations of the symbols in question are tested. This can be ensured by proper choice of coding and interleaving pattern according to the following guidelines.

A rate 1/n coder will produce n output symbols for each input symbol. Conversely, a rate 1/n decoder will process n received symbols to output one decoded symbol. The n received symbols are preferably distributed in time over several transmitted segments so as to reduce the effect of fading. In the foregoing exemplary embodiments, it has, for example, been suggested that consecutive symbols from the encoder are placed first next to known sync symbols and then next to said first placed symbols and so-on. If there are n positions next to known sync symbols available, then the n coded symbols for each uncoded symbol will exhaust those positions and the next (n+1)th coded symbols will be placed adjacent to the first coded symbol. However, since the decoder only outputs one decoded symbol into its path history memory for each coded symbol which is processed, coded symbols 1 and (n+1) depend on symbols one symbol apart in the path history memory. If the code constraint length is m symbols, then decoded symbols m-1 apart are still within the ML-tap that guarantees all combinations of those two symbols will be tested. The interleaver can thus place n(m-1) coded symbols in time-dispersed positions before placing the next n next to the first n while keeping two symbols in adjacent positions in transmitted signal segments within the range of Maximum Likelihood taps, thus ensuring that all combinations of the two symbols will be hypothesized. This in turn ensures that all possible signal sample values that depend on the two adjacent symbols will be predicted and compared with received sample values, giving a performance that is not then sensitive to whether sample timing lies in the middle of a symbol or between symbols. In this way it is also possible to cope with channel imperfections that cause received samples to depend on more than one adjacently transmitted symbol, i.e., echoes that are delayed by up to one symbol period. Such a transmission scheme may thus be advantageously used over mobile radio channels that suffer from multipath propagation.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What is claimed is:

1. A method of transmitting and receiving digital data including unknown arbitrary information symbols, comprising the steps of:

coding the unknown arbitrary information symbols and interleaving said unknown arbitrary information symbols, to separate adjacent unknown arbitrary information symbols from each other after they are coded;

inserting at least one known symbol next to one of at least two adjacent unknown arbitrary information symbols after the unknown arbitrary information are coded and interleaved;

decoding the one of said at least two adjacent unknown arbitrary information symbols which is next to said known symbol, to generate a decoded known symbol, and decoding the other of said at least two adjacent arbitrary information symbols, to generate another decoded known symbol based on the previously decoded known symbol.

2. A method according to claim 1 further comprising the step of modulating said adjacent unknown arbitrary information symbols after they are coded and interleaved and said known symbol onto a radio frequency signal.

3. A method according to claim 2 in which said steps of modulating comprises the further step of:

representing said unknown arbitrary information symbols after they are coded and interleaved and said known symbol by vector changes between signal samples representing said digital data which are taken at intervals one symbol period apart.

4. A method according to claim 3 further comprising the step of:

placing a coded bit in one of two bit positions of quaternary symbols in a first transmitted signal segment and another coded bit in the other bit position of quaternary symbols in a subsequently transmitted signal segment.

5. A method according to claim 4 in which said step of modulating is performed using a I,Q filtered Pi/4-DQPSK technique.

6. A method according to claim 4 in which step of modulating is performed using a Continuous Phase Modulation technique producing approximately constant amplitude signals.

7. A method according to claim 1 in which said coding is block error correction coding.

8. A method according to claim 1 in which said coding is convolutional coding.

9. A method according to claim 1 in which said coding is punctured convolutional coding.

10. A method according to claim 3 wherein said step of modulating further comprises the step of:

using M-ary symbol modulation in which said vector changes can be any one of a number M of predefined changes equal to an integer power N of two.

11. A method according to claim 10 in which said vector changes each encode a number of information or known bits equal to said integer N.

12. A method according to claim 11 further comprising the steps of:

placing coded information bits first in a first of said integer number N of bits conveyed by each of said M-ary symbols that are transmitted as a first signal segment; and subsequently placing coded information bits in a second of said integer number N of bit positions of M-ary symbols carried by a second transmitted signal segment.

13. A method according to claim 12 further comprising the step of:

continuing to place coded information bits in bit positions of said M-ary symbols corresponding to the signal segment containing said M-ary symbols until a number of signal segments equal to said integer N has been used.

14. A method according to claim 1 further comprising the steps of:

skipping over, in said receiver, uncoded symbols while decoding said coded symbols; and then returning to estimate said uncoded symbols using already decoded symbols.

15. A decoding and demodulation apparatus for processing a coded, interleaved and modulated radio signal to extract digital information, comprising:

means for producing numerical samples corresponding to a received radio signal that include at least one known symbol positioned next to at least two adjacent unknown arbitrary information symbols;

means for storing a number of said numerical samples in a buffer memory;

means for processing samples from said buffer memory, including:

means for storing symbol sequence hypotheses which have been tested;

means for storing a cumulative figure of merit or demerit for each of said tested sequences as path metrics;

means for storing estimates of signal phase or amplitude at plural time positions corresponding to sample values in said buffer memory; means for predicting a sample value based on said symbol sequence hypotheses and the estimates of signal phase or amplitude employing a model of said coding, interleaving and modulation;

means for comparing said predictions with said numerical samples in said buffer memory and to produce mismatch values which are summed into said cumulative figure;

means for selecting previous path metrics as a best predecessor for accumulating with said mismatch values such that said path metrics are the lowest possible, and means for updating said stored estimates after said selection and copying said updated, stored estimates from a memory location associated with said selected best predecessor to a memory location associated with a successor sequence hypothesis.

16. A decoding and demodulation apparatus according to claim 15 further including:

error detection means for operating on at least one of said hypothesized symbol sequences at predetermined intervals, and means for deleting hypothesized sequences from said path history memory as indicated by said error correction means.

17. A receiving apparatus for decoding blocks of coded and interleaved information signals that include at least one known symbol positioned next to at least two adjacent unknown arbitrary information symbols, comprising:

de-interleaving means for selecting received signal samples alternately from a first received signal segment and a second received signal segment; and decoding means for decoding the one unknown arbitrary information symbol, which is next to said known symbol, to generate a decoded known symbol, and decoding the other adjacent arbitrary information symbol, which is not next to said known symbol, to generate another decoded known symbol based on the previously decoded known symbol.

18. A receiving apparatus according to claim 17 in which said decoding means is a block error correction decoder.

19. A receiving apparatus according to claim 17 in which said decoding means is a convolutional error correction decoder.

20. A receiving apparatus according to claim 17 in which said decoding means is a block error correction decoder.

21. A receiving apparatus according to claim 17 in which said decoding means is a convolutional error correction decoder.

22. A receiving apparatus for decoding blocks of coded and interleaved information signals that include at least one known symbol positioned next to at least two adjacent unknown arbitrary information symbols, comprising:

de-interleaving means for selecting received signals samples from a first received signal segment and from a second received signal segment; and decoding means for decoding the one unknown arbitrary information symbol, which is next to said known symbol, to generate a decoded known symbol, and decoding the other adjacent arbitrary information symbol, which is not next to said known symbol, to generate another decoded known symbol based on the previously decoded known symbol.

23. A receiving apparatus according to claim 22 in which said decoding means is a block error correction decoder.

24. A receiving apparatus according to claim 22 in which said decoding means is a convolutional error correction decoder.

25. A receiving apparatus decoding coded and interleaved information signals that include at least one known symbol positioned next to at least two adjacent unknown arbitrary information symbols, comprising:

de-interleaving means for selecting a current symbol block of samples partly from a currently received signal segment and partly from at least one previously received segment;

decoding means for decoding the one unknown arbitrary information symbol, which is next to said known symbol, to generate a decoded known symbol, and decoding the other adjacent arbitrary information symbol, which is not next to said known symbol, to generate another decoded known symbol based on the previously decoded known symbol.

26. A receiving apparatus according to claim 25 in which said decoding means is a block error correction decoder.

27. A receiving apparatus according to claim 25 in which said decoding means is a convolutional error correction decoder.

28. A receiving apparatus for decoding coded and interleaved data symbol blocks that include at least one known symbol positioned next to at least two adjacent unknown arbitrary information symbols, comprising:

de-interleaving means for selecting symbol blocks of received signal samples for decoding partly from a currently received signal segment and partly from at least one previously received signal segment;

decoder means for decoding the one unknown arbitrary information symbol, which is next to said known symbol, to generate a decoded known symbol, and decoding the other adjacent arbitrary information symbol, which is not next to said known symbol, to generate another decoded known symbol based on the previously decoded known symbol; and processing means for processing said symbol blocks in which decoded known symbols from a later processed symbol block are used in reprocessing a previously processed symbol block to produce an improved corresponding decoded symbol block.

29. A receiving apparatus according to claim 28 in which said decoding means is a block error correction decoder.

30. A receiving apparatus according to claim 28 in which said decoding means is a convolutional error correction decoder.

31. A receiving apparatus for decoding coded and interleaved data symbol blocks that include at least one known symbol positioned next to at least two adjacent unknown arbitrary information symbols, comprising:

de-interleaving means for selecting symbol blocks of received signal samples for decoding partly from a currently received signal segment and partly from at least one previously received signal segment;

decoder means for decoding the one unknown arbitrary information symbol, which is next to said known symbol, to generate a decoded known symbol, and decoding the other adjacent arbitrary information symbol which is not next to said known symbol, to generate another decoded known symbol based on the previously decoded known symbol; and processing means for processing said symbol blocks in which decoded known symbols from a currently decoded symbol block and decoded known symbols from a symbol block two symbol blocks prior to the currently decoded symbol block are used in reprocessing the symbol block processed just prior to the current symbol block to produce an improved decoded symbol block corresponding thereto.

32. A receiving apparatus according to claim 31 in which said decoding means is a block error correction decoder.

33. A receiving apparatus according to claim 31 in which said decoding means is a convolutional error correction decoder.

34. A receiving apparatus for decoding coded and interleaved data symbol blocks that include at least one known symbol positioned next to at least two adjacent unknown arbitrary information symbols, comprising:

de-interleaving means for selecting symbol blocks of received signal samples for decoding alternately from a first received signal segment and a second received signal segment;

decoding means for decoding the one unknown arbitrary information symbol, which is next to said known symbol to generate a decoded known symbol, and decoding the other adjacent arbitrary information symbol, which is not next to said known symbol, to generate another decoded known symbol based on error check indications for the previously decoded known symbol; and error detection means for providing said error check indications.

35. The receiving apparatus for decoding coded and interleaved data symbol blocks of claim 34, said first received signal segment is a currently received signal segment and said second received signal segment is a previously received signal segment.

36. A system for transmitting and receiving digital information symbols, comprising:

transmitter means for coding at least some of said digital information symbols for transmission, interleaving coded symbols with uncoded symbols and modulating said interleaved symbols on to a carrier signal, wherein said modulated coded and interleaved symbols that include at least one known symbol positioned next to at least two adjacent unknown arbitrary information symbols;

means for receiving said carrier signal, filtering, amplifying, sampling and converting signal samples into a suitable form for processing;

means for demodulating signal samples corresponding at least to said coded, interleaved and modulated symbols; and means for decoding the one unknown arbitrary information symbol, which is next to said known symbol, to generate a decoded known symbol, and decoding the other adjacent arbitrary information symbol, which is not next to said known symbol, to generate another decoded known symbol based on the previously decoded known symbol.

37. A receiving apparatus for decoding signals modulated with coded and interleaved data symbol blocks that include at least one known symbol positioned next to at least two adjacent unknown arbitrary information symbols, comprising:

de-interleaving means for selecting symbol blocks of received signal samples for decoding alternately from a first received signal segment and a second received signal segment;

decoding means for decoding the one unknown arbitrary information symbol, which is next to said known symbol, to generate a decoded known symbol, and decoding the other adjacent arbitrary information symbol, which is not next to said known symbol, to generate another decoded known symbol based on reliability indications for the previously decoded known symbol; and decoding reliability indicator means for providing said reliability indications.

38. The receiving apparatus according to claim 37 in which said decoding reliability indication is based on path metric growth.

39. The receiving apparatus according to claim 37 in which said decoding reliability indicator means determines if a syndrome corresponds to a correctable error pattern or corresponds to no errors.

40. A receiving apparatus for demodulating and decoding information symbols that include at least one known symbol positioned next to at least two adjacent unknown arbitrary information symbols, wherein at least some of the unknown arbitrary information symbols are error correction coded and which are interleaved and modulated on to a radio signal comprising:

means for receiving said radio signal;

means for converting said received radio signal into a suitable form for sampling;

means for sampling said converted radio signal and converting samples into numerical values related to instantaneous amplitude and values related to instantaneous phase; and means for processing said numerical values to demodulate and decode them and to produce decoded symbols corresponding to said coded information symbols, wherein the one unknown arbitrary information symbol, which is next to said known symbol, is decoded first to generate a decoded known symbol, and the other adjacent arbitrary information symbol, which is not next to said known symbol, is decoded next to generate another decoded known symbol based on the previously decoded known symbol.

41. Receiving apparatus for demodulating and decoding information symbols that include at least one known symbol positioned next to at least two adjacent unknown arbitrary information symbols, wherein the information symbols are grouped in a first group that are coded and modulated on to a radio signal in a first manner and a second group that are coded and modulated in a second manner, comprising:

a means for receiving said radio signal;

means for converting said received radio signal into a suitable form for sampling;

means for sampling said converted radio signal and converting samples into numerical values related to instantaneous amplitude and values related to instantaneous phase;

means for processing said numerical values to demodulate and decode them and to produce decoded symbols corresponding to information symbols coded and modulated in said first manner, wherein the one unknown arbitrary information symbol, which is next to said known symbol in the first group, is decoded first to generate a decoded known symbol, and the other adjacent arbitrary information symbol, which is not next to said known symbol, is decoded next to generate another decoded known symbol based on the previously decoded known symbol; and means for processing said decoded symbols and said numerical values to produce symbols corresponding to information symbols coded and modulated in said second manner, wherein the one unknown arbitrary information symbol, which is next to said known symbol in second first group, is decoded first to generate a decoded known symbol, and the other adjacent arbitrary information symbol, which is not next to said known symbol, is decoded next to generate another decoded known symbol based on the previously decoded known symbol.

42. A receiving apparatus according to claim 41 which said first manner modulates symbols as a vector change between signal values one symbol period apart in time and said second manner modulates symbols as vector changes between signal values more than one symbol period apart.

43. A receiving apparatus for demodulating and decoding information symbols that include at least one known symbol positioned next to at least two adjacent unknown arbitrary information symbols, wherein the information symbols are grouped in a first group that are coded and modulated on to a radio signal in a first manner and a second group that are coded and modulated in a second manner, comprising:

means for receiving said radio signal;

means for converting said received radio signal into a suitable form for sampling;

means for sampling said converted radio signal and converting said samples into complex numerical values;

means for processing said complex numerical values to demodulate and decode them and to produce decoded symbols corresponding to information symbols coded and modulated in said first manner, wherein the one unknown arbitrary information symbol, which is next to said known symbol in the first group, is decoded first to generate a decoded known symbol, and the other adjacent arbitrary information symbol, which is not next to said known symbol, is decoded next to generate another decoded known symbol based on the previously decoded known symbol; and means for processing said decoded symbols and said numerical values to produce symbols corresponding to information symbols coded and modulated in said second manner, wherein the one unknown arbitrary information symbol, which is next to said known symbol in second first group, is decoded first to generate a decoded known symbol, and the other adjacent arbitrary information symbol, which is not next to said known symbol, is decoded next to generate another decoded known symbol based on the previously decoded known symbol.

* * * * *